(12) United States Patent
Chen et al.

(10) Patent No.: US 11,404,413 B2
(45) Date of Patent: Aug. 2, 2022

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Kuan-Jung Chen, Tainan (TW); I-Chih Chen, Tainan (TW); Chih-Mu Huang, Tainan (TW); Kai-Di Wu, Tainan (TW); Ming-Feng Lee, Chiayi County (TW); Ting-Chun Kuan, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 384 days.

(21) Appl. No.: 16/151,329

(22) Filed: Oct. 3, 2018

(65) Prior Publication Data
US 2019/0139956 A1    May 9, 2019

Related U.S. Application Data

(60) Provisional application No. 62/583,452, filed on Nov. 8, 2017.

(51) Int. Cl.
*H01L 27/088*    (2006.01)
*H01L 29/10*    (2006.01)
(Continued)

(52) U.S. Cl.
CPC .. *H01L 27/0886* (2013.01); *H01L 21/823431* (2013.01); *H01L 21/823821* (2013.01);
(Continued)

(58) Field of Classification Search
CPC .............. H01L 27/0886; H01L 29/785; H01L 29/66818; H01L 29/7848;
(Continued)

(56) References Cited

U.S. PATENT DOCUMENTS 8,836,016 B2    9/2014    Wu et al.
8,841,701 B2    9/2014    Lin et al.
(Continued)

*Primary Examiner* — Brigitte A Paterson
*Assistant Examiner* — Lawrence C Tynes, Jr.
(74) *Attorney, Agent, or Firm* — JCIPRNET

(57) ABSTRACT

A semiconductor device includes a semiconductor substrate having a first region and a second region, insulators, gate stacks, and first and second S/Ds. The first and second regions respectively includes at least one first semiconductor fin and at least one second semiconductor fin. A width of a middle portion of the first semiconductor fin is equal to widths of end portions of the first semiconductor fin. A width of a middle portion of the second semiconductor fin is smaller than widths of end portions of the second semiconductor fin. The insulators are disposed on the semiconductor substrate. The first and second semiconductor fins are sandwiched by the insulators. The gate stacks are over a portion of the first semiconductor fin and a portion of the second semiconductor fin. The first and second S/Ds respectively covers another portion of the first semiconductor fin and another portion of the second semiconductor fin.

20 Claims, 30 Drawing Sheets

(51) Int. Cl.
*H01L 29/423* (2006.01)
*H01L 29/66* (2006.01)
*H01L 21/8234* (2006.01)
*H01L 29/78* (2006.01)
*H01L 21/8238* (2006.01)
*H01L 27/092* (2006.01)

(52) U.S. Cl.
CPC ...... *H01L 27/0924* (2013.01); *H01L 29/1037* (2013.01); *H01L 29/42372* (2013.01); *H01L 29/66545* (2013.01); *H01L 29/66818* (2013.01); *H01L 29/785* (2013.01); *H01L 29/7848* (2013.01)

(58) Field of Classification Search
CPC ......... H01L 21/823821; H01L 27/0924; H01L 29/1037; H01L 29/66545; H01L 21/823431; H01L 29/42372; H01L 29/36–365
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2005/0275117 A1* | 12/2005 | Kang | G11C 11/412 257/427 |
| 2014/0273378 A1* | 9/2014 | Rodder | H01L 21/845 438/283 |
| 2015/0041911 A1* | 2/2015 | Chan | H01L 27/0924 257/369 |
| 2016/0211138 A1* | 7/2016 | Huang | H01L 21/30604 |
| 2017/0133376 A1* | 5/2017 | Glass | H01L 29/0847 |
| 2017/0133377 A1* | 5/2017 | Glass | H01L 21/3065 |
| 2017/0179129 A1* | 6/2017 | Li | H01L 21/02115 |
| 2017/0179274 A1* | 6/2017 | Karve | H01L 29/1054 |
| 2018/0019327 A1* | 1/2018 | Hsu | H01L 21/76224 |

* cited by examiner

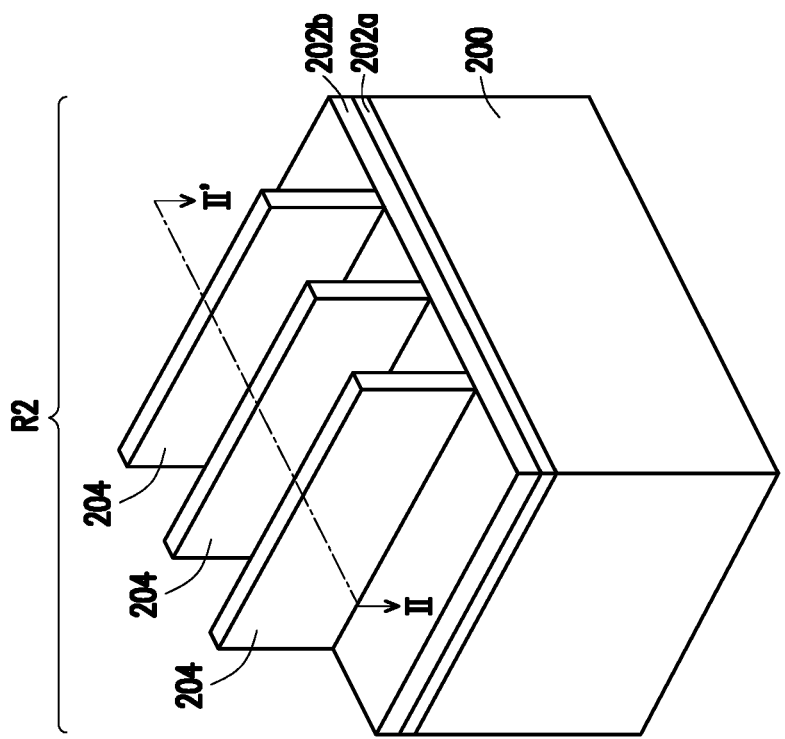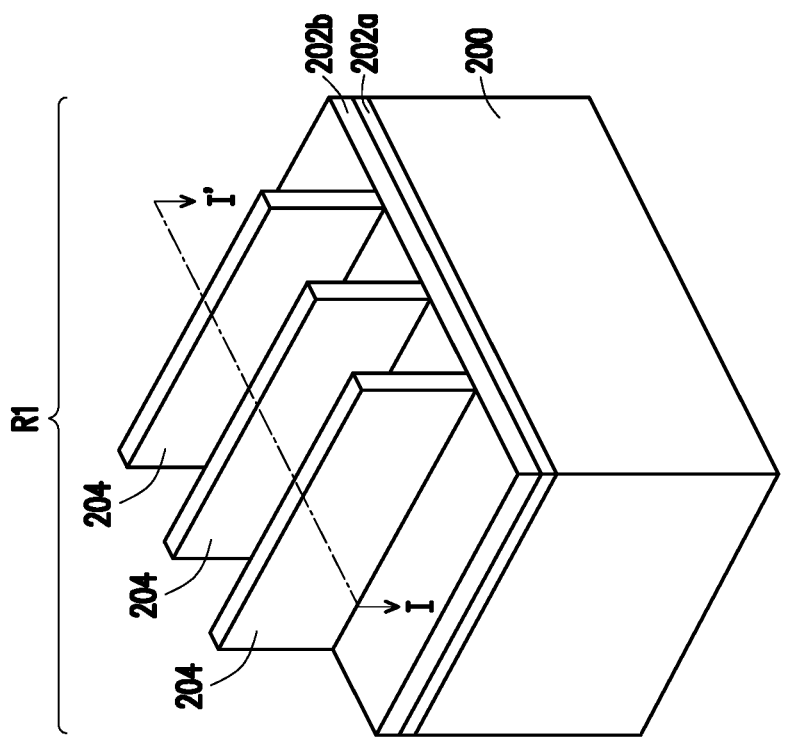
FIG. 1A

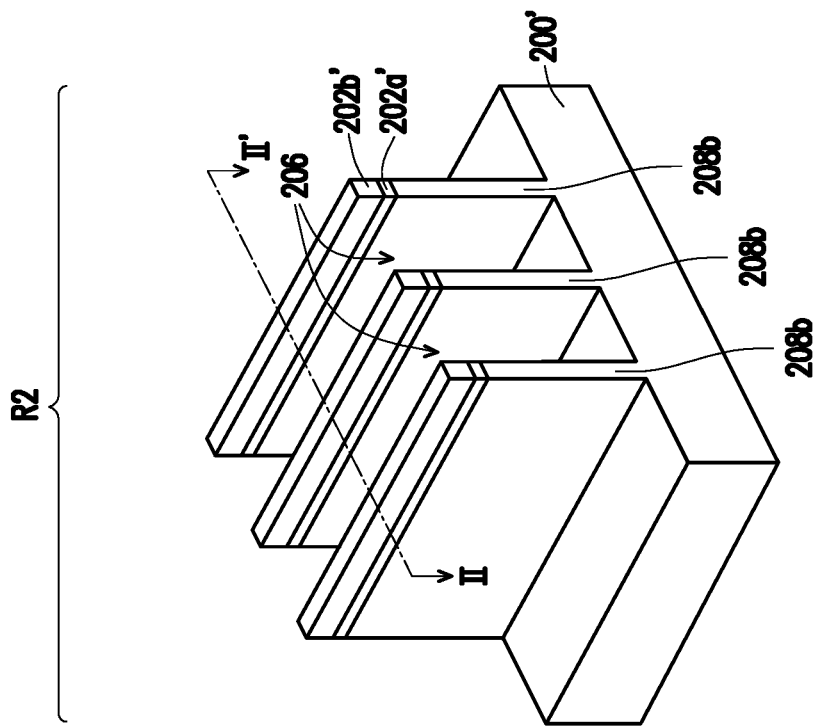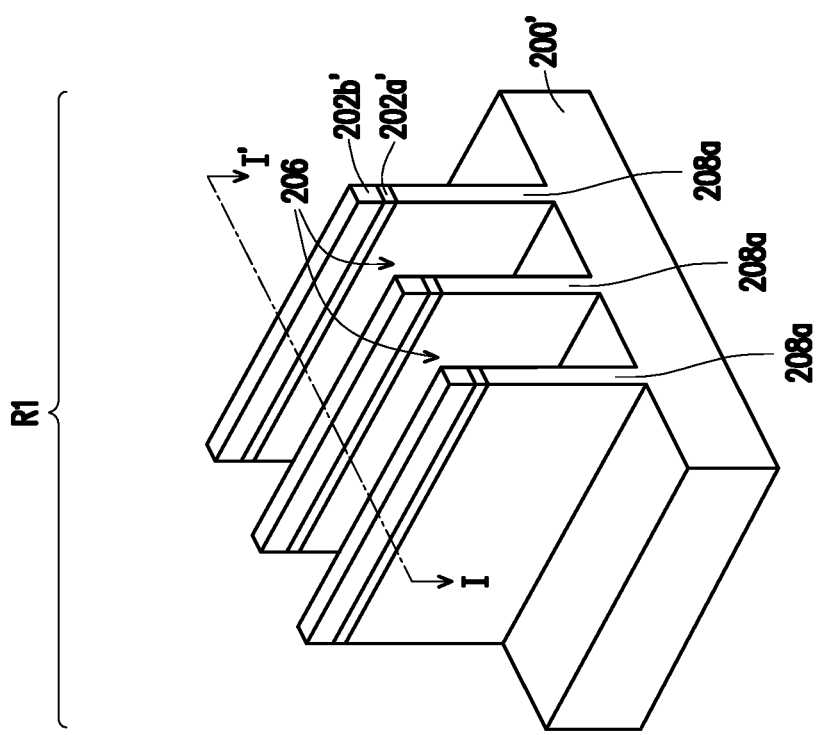
FIG. 1B

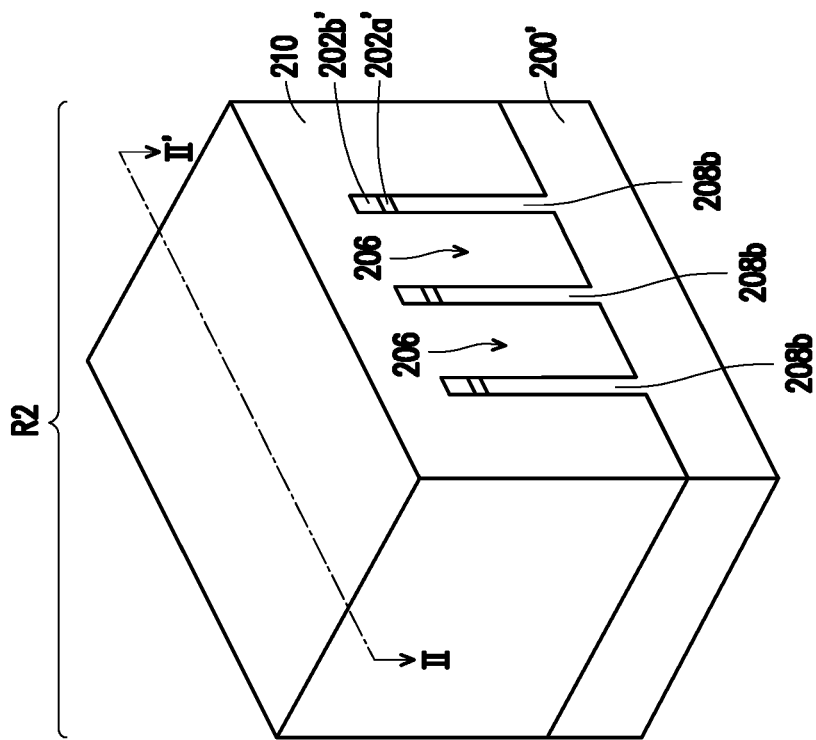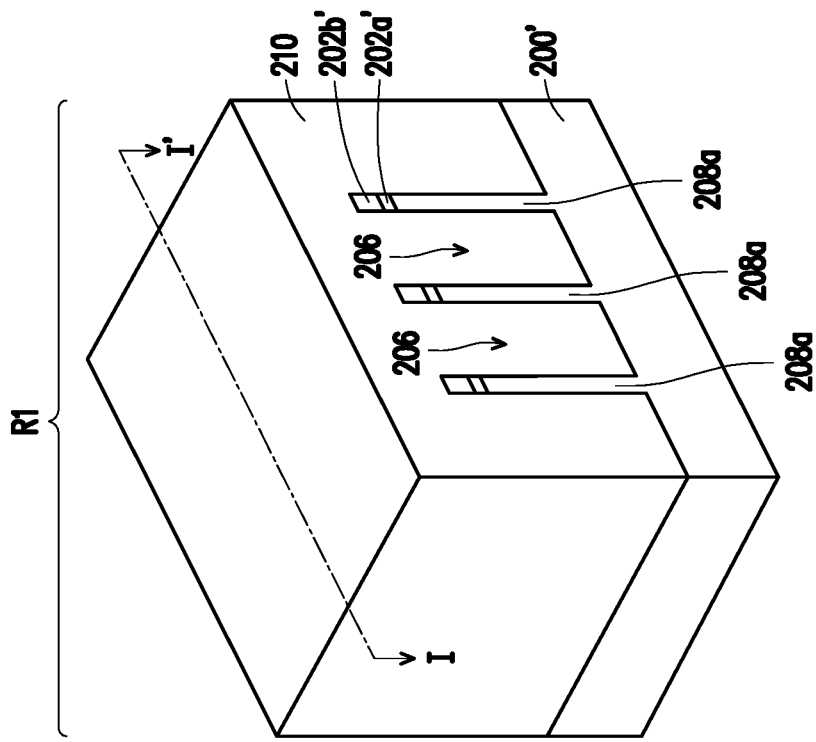
FIG. 1C

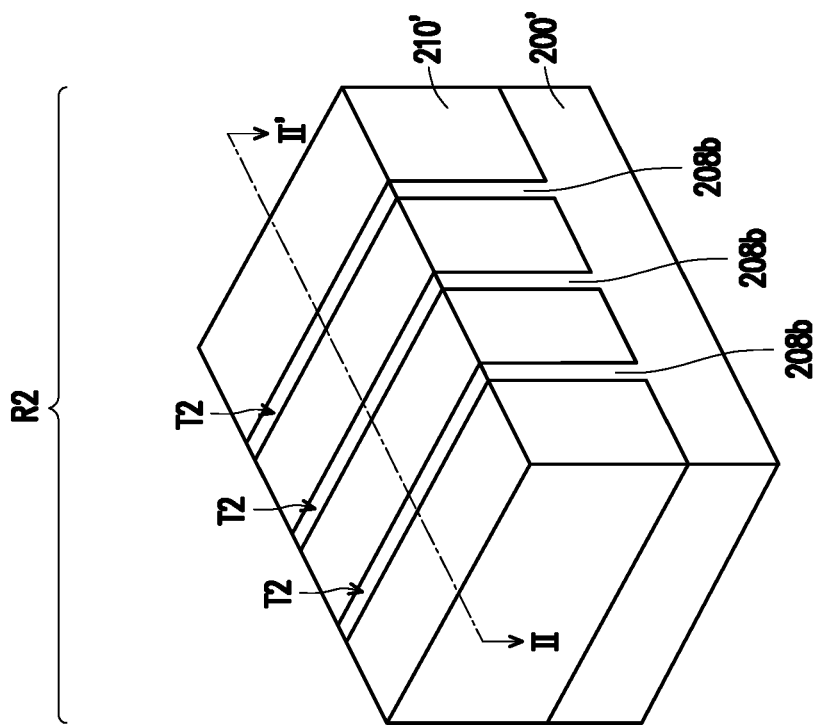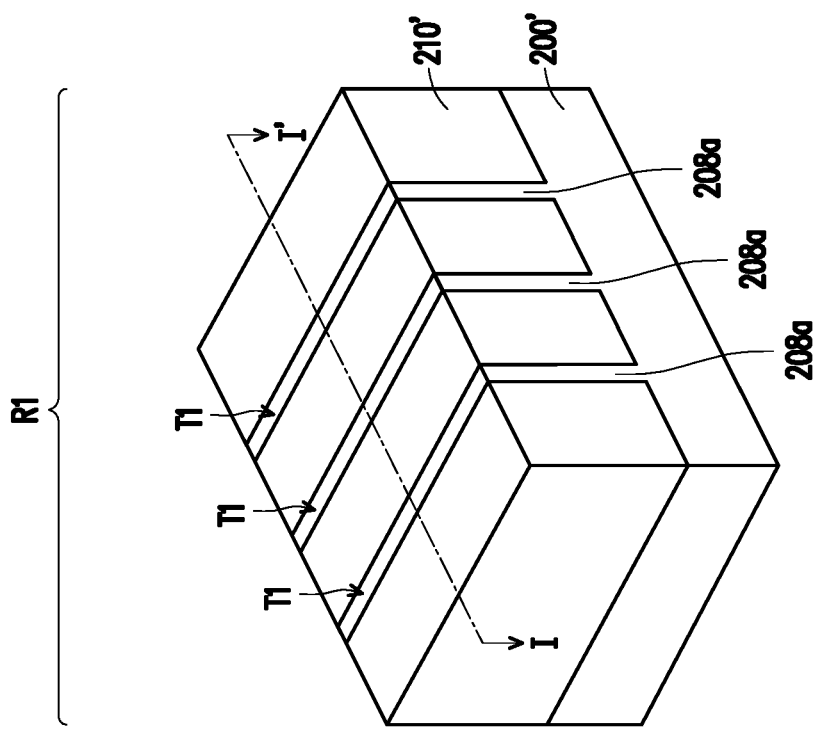
FIG. 1D

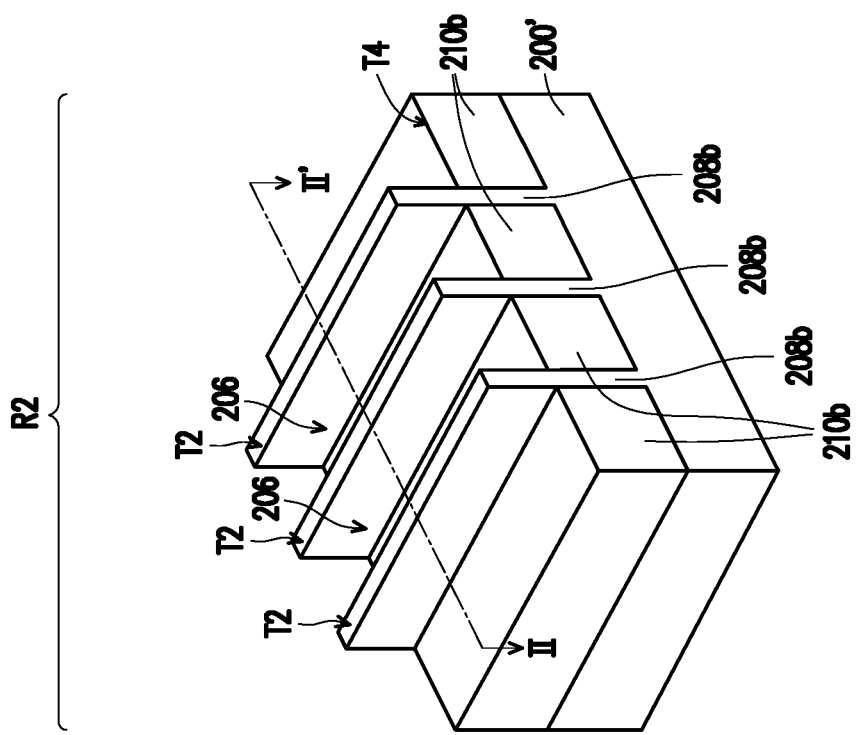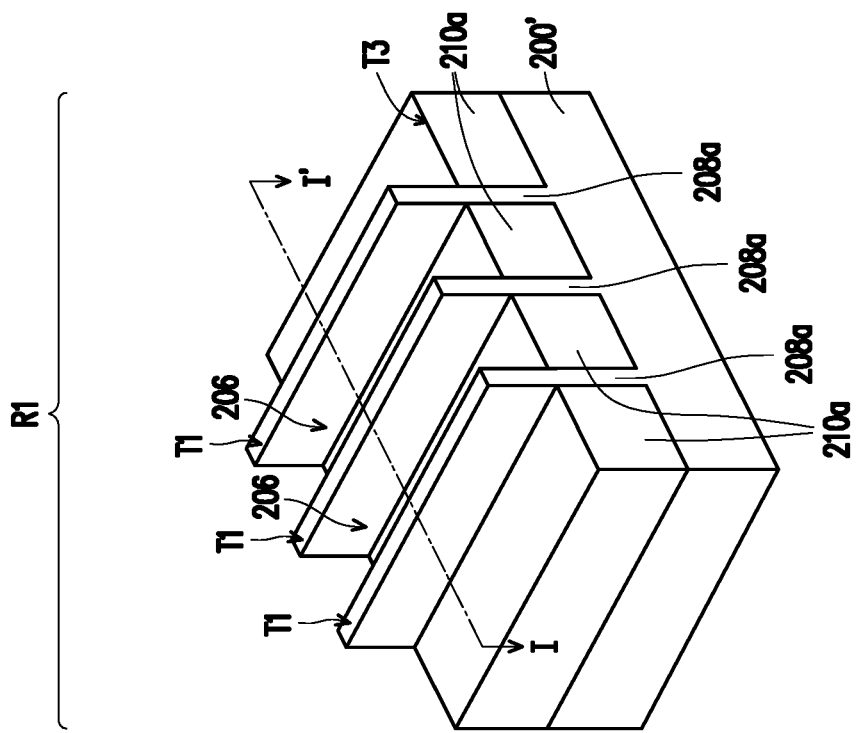
FIG. 1E

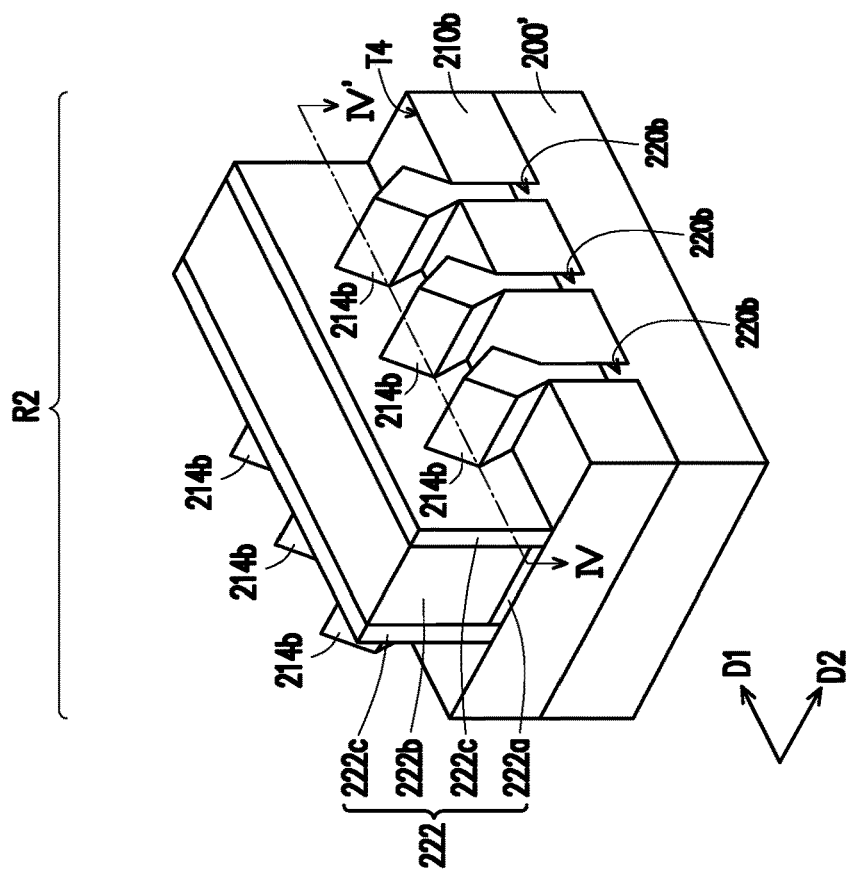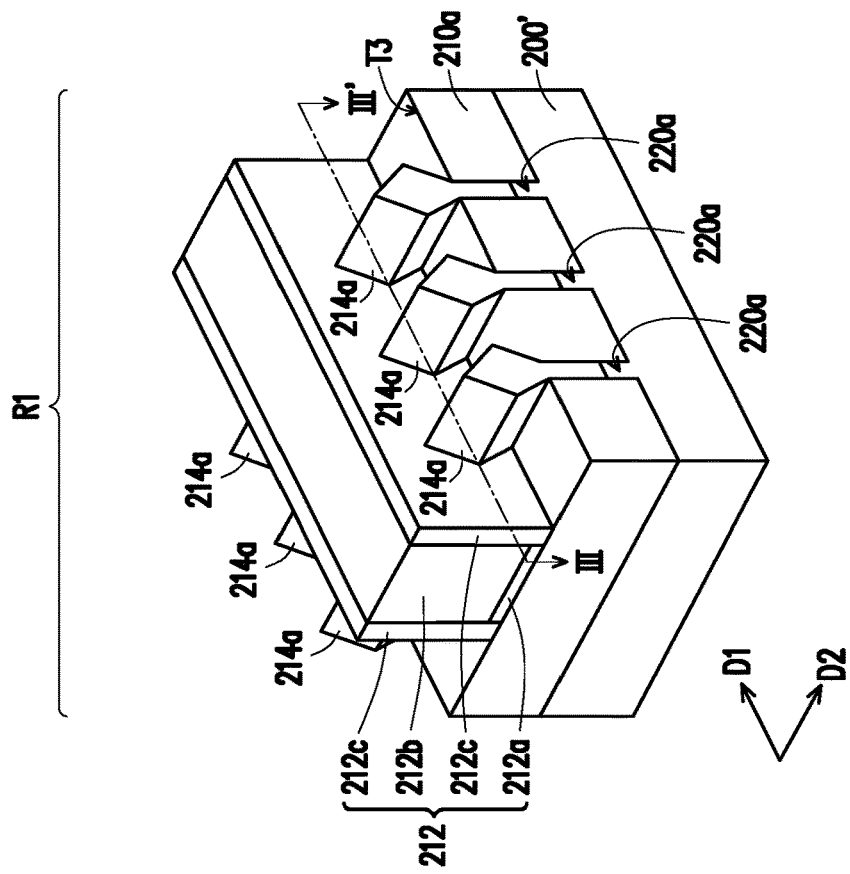
FIG. 1H

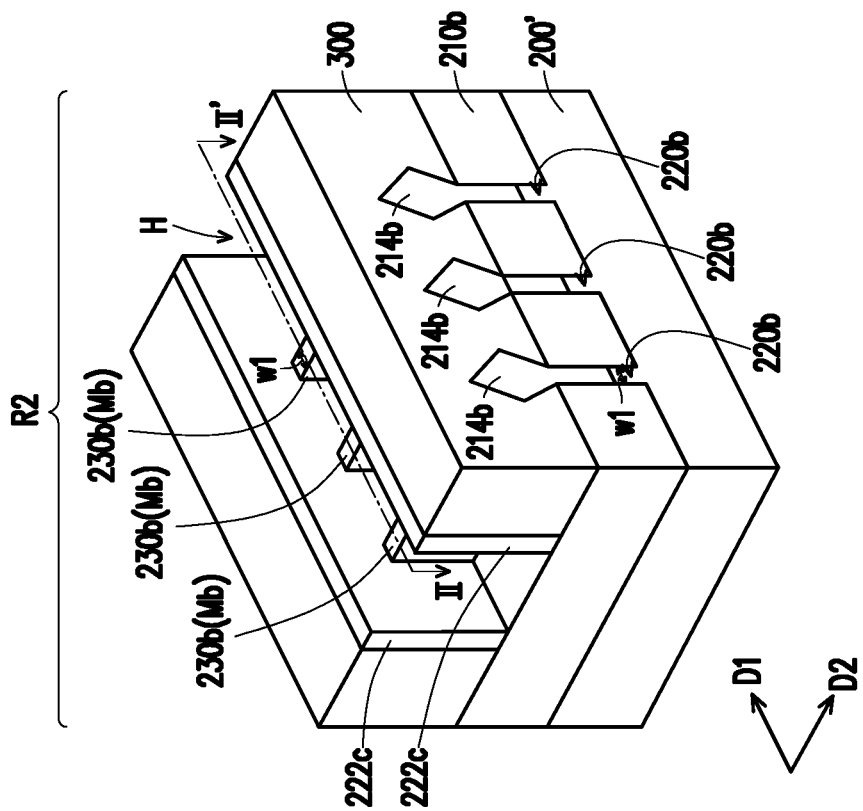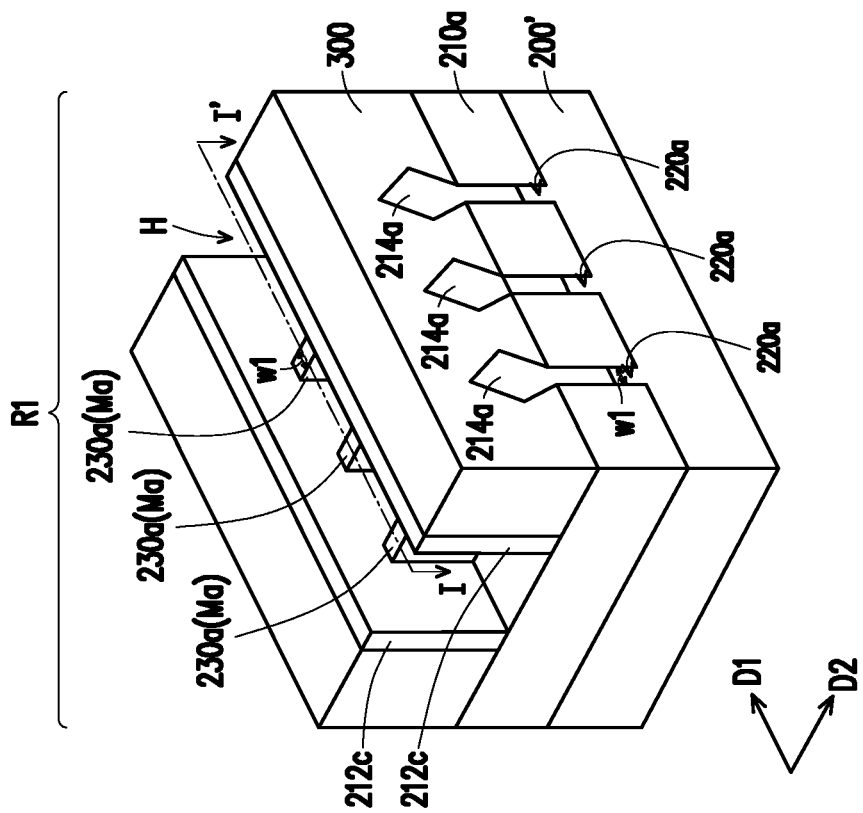
FIG. 1J

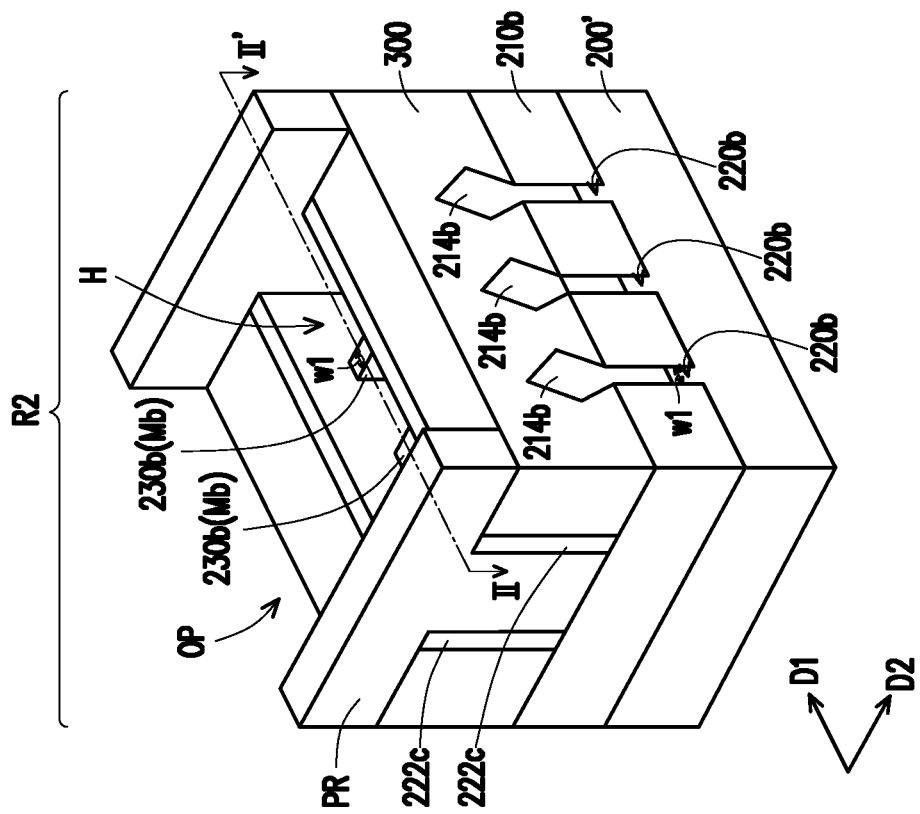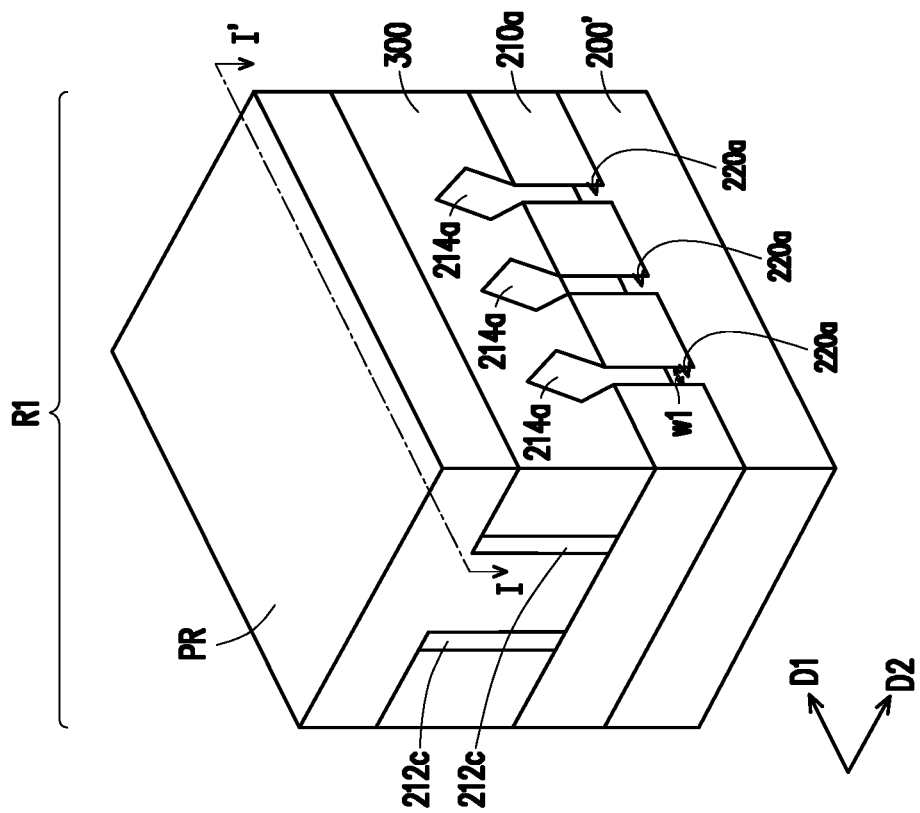
FIG. 1K

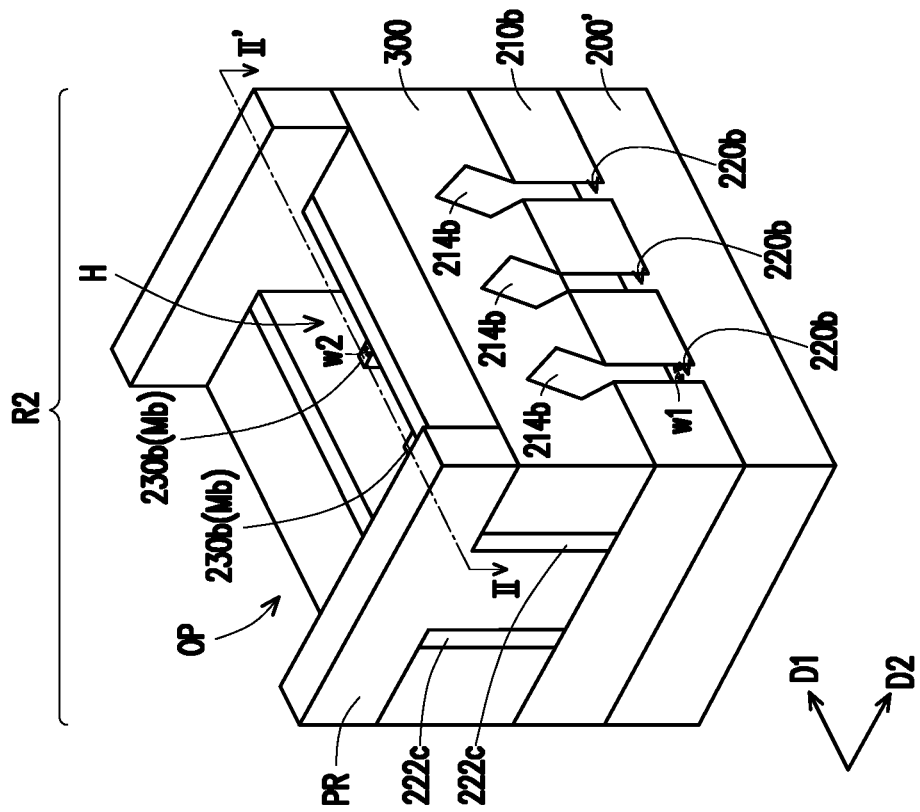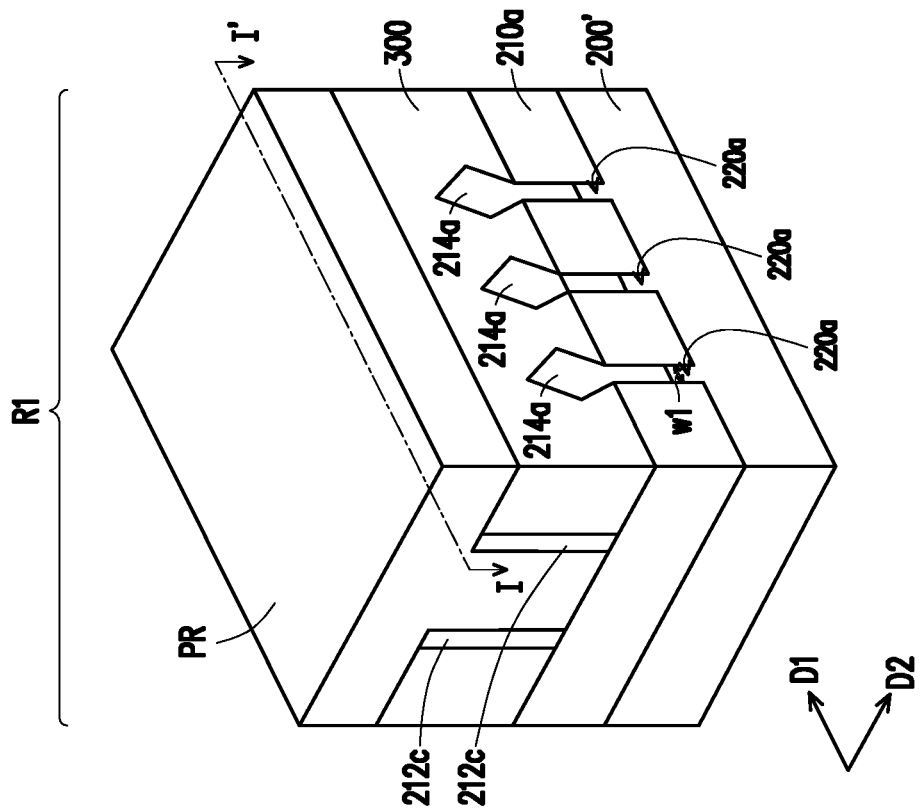
FIG. 1L

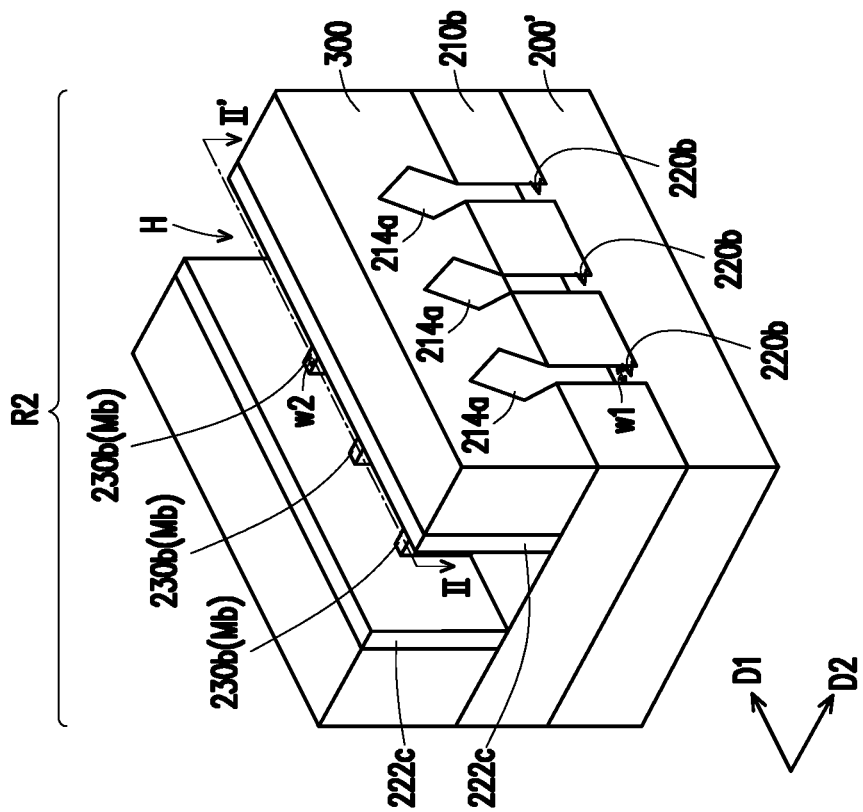
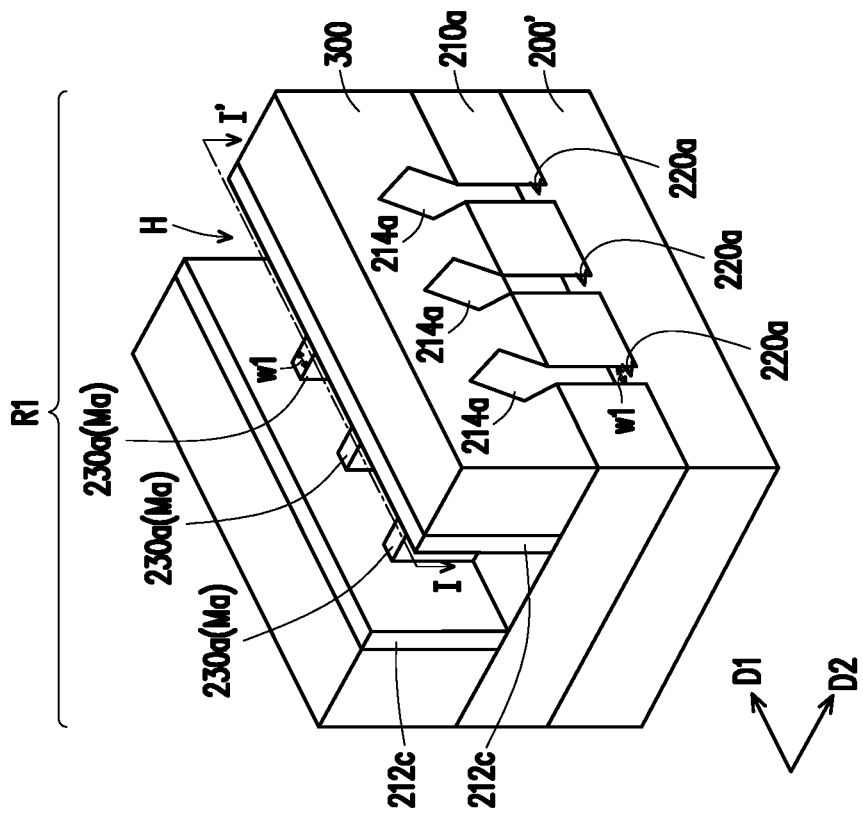
FIG. 1M

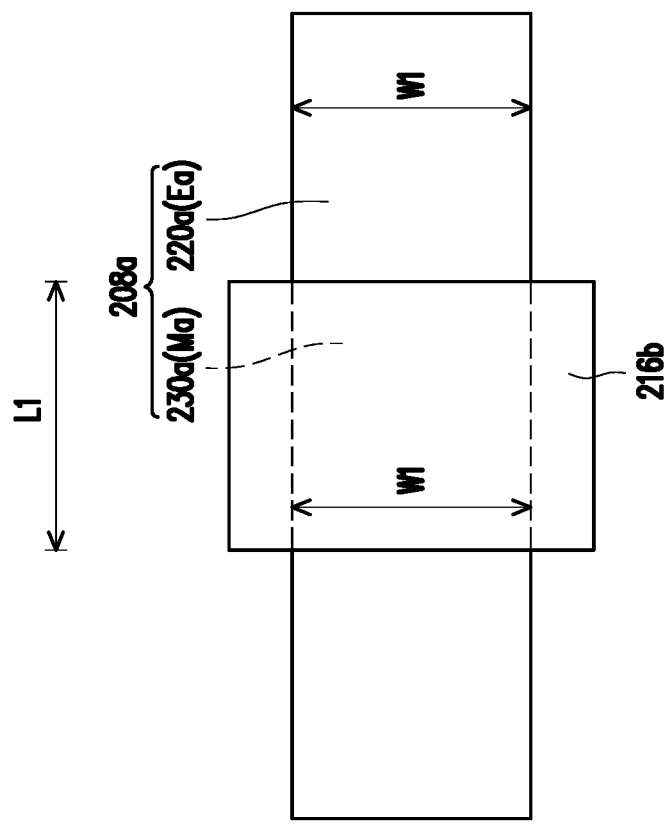

SEMICONDUCTOR DEVICE AND MANUFACTURING METHOD THEREOF

CROSS-REFERENCE TO RELATED APPLICATION

This application claims the priority benefits of U.S. provisional application Ser. No. 62/583,452, filed on Nov. 8, 2017. The entirety of the above-mentioned patent application is hereby incorporated by reference herein and made a part of this specification.

BACKGROUND

As the semiconductor devices keep scaling down in size, three-dimensional multi-gate structures, such as the fin-type field effect transistor (FinFET), have been developed to replace planar CMOS devices. A characteristic of the FinFET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a top view of a semiconductor fin and a gate electrode in a FinFET located in a first region of a semiconductor device in accordance with some embodiments of the present disclosure.

DETAILED DESCRIPTION

Figure 1F:
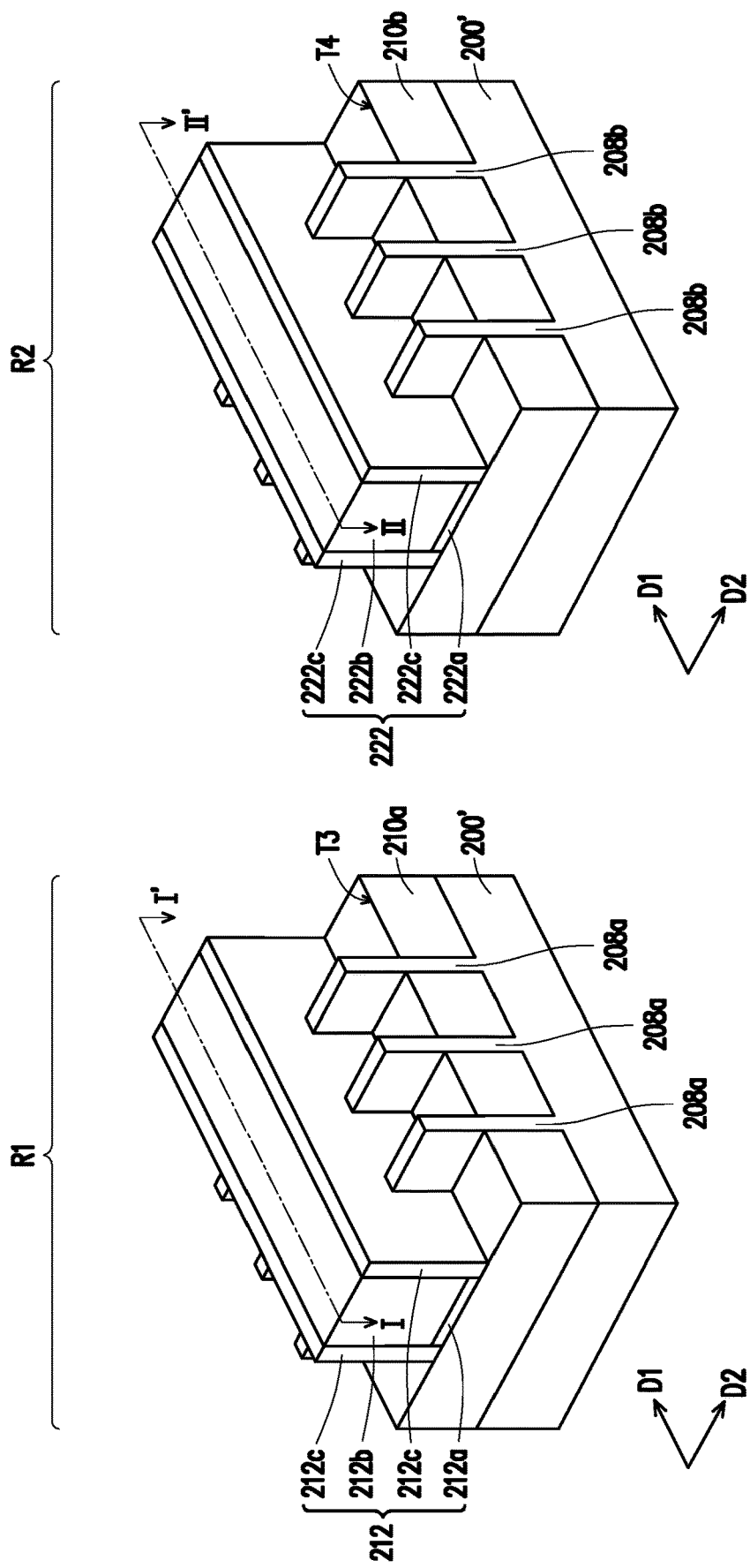
FIG. 1A to FIG. 1N are perspective views illustrating various stages of a method of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the present disclosure describe the exemplary manufacturing process of a semiconductor device including FinFETs. The FinFET may be formed on bulk silicon substrates in certain embodiments of the present disclosure. Still, the FinFET may be formed on a silicon-on-insulator (SOI) substrate, a germanium-on-insulator (GOI) substrate, a SiGe substrate or a Group III-V semiconductor substrate as alternatives. Also, in accordance with some embodiments, the silicon substrate may include other conductive layers or other semiconductor elements, such as transistors, diodes or the like. The embodiments are not limited in this context.

FIG. 1A is a perspective view illustrating one of various stages of a method of manufacturing a semiconductor device 10 in accordance with some embodiments of the present disclosure. FIG. 2A is a cross-sectional view of the semiconductor device 10 taken along line I-I' and II-II'. Referring to FIG. 1A and FIG. 2A, a semiconductor substrate 200 is provided. In some embodiments, the semiconductor substrate 200 includes a crystalline silicon substrate (e.g., wafer). In some alternative embodiments, the semiconductor substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The semiconductor substrate 200 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or a combination thereof. Depending on the dopant type, an n-type FinFET or a p-type FinFET may be formed on the semiconductor substrate 200 in the subsequent processes. In some embodiments, the dopant concentration in various doped regions may be different. For example, the semiconductor substrate 200 may have a first region R1 and a second region R2 with different dopant concentrations. In some embodiments, the first region R1 and the second region R2 are adjacent to each other. In some alternative embodiments, the first region R1 and the second region R2 are separated from each other. In some embodiments, the operation voltage for the devices located in the second region R2 may be lower than the operation voltage for the devices located in the first region R1. The devices formed within the first region R1 and the device formed within the second region R2 may respectively perform different functions in the semiconductor device 10. For example, the devices located in the first region R1 may include Static Random-Access Memory (SRAM), Central Processing Unit (CPU), Graphics Processing Unit (GPU), and the like. On the other hand, the devices located in the second region R2 may be utilized to perform ultra-low power applications. Thus, in some embodiments, the second region R2 is referred to as "ultra-low power region."

In some embodiments, a pad layer 202a and a mask layer 202b are sequentially formed on the semiconductor substrate 200. The pad layer 202a may be a silicon oxide thin film formed by, for example, a thermal oxidation process. The pad layer 202a may act as an adhesion layer between the semiconductor substrate 200 and the mask layer 202b. The pad layer 202a may also act as an etch stop layer for etching the mask layer 202b. In some embodiments, the mask layer 202b may be a silicon nitride layer formed by low-pressure chemical vapor deposition (LPCVD) or plasma enhanced chemical vapor deposition (PECVD). The mask layer 202b is used as a hard mask during subsequent photolithography processes. A patterned photoresist layer 204 having a predetermined pattern is formed on the mask layer 202b.

FIG. 1B is a perspective view illustrating one of various stages of a method of manufacturing a semiconductor device 10 in accordance with some embodiments of the present disclosure. FIG. 2B is a cross-sectional view of the semiconductor device 10 taken along line I-I' and II-II'. Referring to FIG. 1B and FIG. 2B, portions of the mask layer 202b and the pad layer 202a not covered by the patterned photoresist layer 204 are sequentially etched to form a patterned mask layer 202b' and a patterned pad layer 202a'. The patterned mask layer 202b' and the patterned pad layer 202a' expose the underlying semiconductor substrate 200. By using the patterned mask layer 202b', the patterned pad layer 202a', and the patterned photoresist layer 204 as a mask, portions of the semiconductor substrate 200 are exposed and etched to form a plurality of trenches 206, a plurality of first semiconductor fins 208a, and a plurality of second semiconductor fins 208b. In some embodiments, the semiconductor substrate 200 may be etched through an isotropic etching process. For example, the semiconductor substrate 200 may be etched through a dry etching process to form a semiconductor substrate 200' having the first semiconductor fins 208a and the second semiconductor fins 208b thereon.

In some embodiments, the first semiconductor fins 208a are located in the first region R1 and the second semiconductor fins 208b are located in the second region R2. In some embodiments, a dopant concentration within the second semiconductor fins 208b is larger than a dopant concentration within the first semiconductor fins 208a. For example, the dopant concentration within the second semiconductor fins 208b may be $2\times10^{12}$ atom/cm$^2$ to $5\times10^{14}$ atom/cm$^2$ and the dopant concentration within the first semiconductor fins 208a may be $2\times10^{11}$ atom/cm$^2$ to $1\times10^{12}$ atom/cm$^2$. In other words, the dopant concentration within the second semiconductor fins 208b is at least five times larger than the dopant concentration within the first semiconductor fins 208a. As illustrated in FIG. 1B and FIG. 2B, the first semiconductor fins 208a and the second semiconductor fins 208b protrude from the semiconductor substrate 200' to separate two adjacent trenches 206. In some embodiments, widths of the first semiconductor fins 208a and the second semiconductor fins 208b may be smaller than 30 nm. In some embodiments, heights of the first and second semiconductor fins 208a, 208b and depths of the trenches 206 range from about 5 nm to about 500 nm. After the trenches 206, the first semiconductor fins 208a, and the second semiconductor fins 208b are formed, the patterned photoresist layer 204 is then removed. Thereafter, a cleaning process may be performed to remove a native oxide of the semiconductor substrate 200', the first semiconductor fins 208a, and the second semiconductor fins 208b. The cleaning process may be performed using diluted hydrofluoric (DHF) acid or other suitable cleaning solutions.

FIG. 1C is a perspective view illustrating one of various stages of a method of manufacturing a semiconductor device 10 in accordance with some embodiments of the present disclosure. FIG. 2C is a cross-sectional view of the semiconductor device 10 taken along line I-I' and II-II'. Referring to FIG. 1C and FIG. 2C, an insulating material 210 is formed over the semiconductor substrate 200'. In some embodiments, the insulating material 210 fills up the trenches 206 and covers the first semiconductor fins 208a, the second semiconductor fins 208b, the patterned pad layer 202a', and the patterned mask layer 202b'. The insulating material 210 may include silicon oxide, silicon nitride, silicon oxynitride, a spin-on dielectric material, or a low-k dielectric material. The low-k dielectric materials are generally referring to dielectric materials having a dielectric constant lower than 3.9. The insulating material 210 may be formed by high-density-plasma chemical vapor deposition (HDP-CVD), sub-atmospheric CVD (SACVD), or spin-on.

FIG. 1D is a perspective view illustrating one of various stages of a method of manufacturing a semiconductor device 10 in accordance with some embodiments of the present disclosure. FIG. 2D is a cross-sectional view of the semiconductor device 10 taken along line I-I' and II-II'. Referring to FIG. 1D and FIG. 2D, a portion of the insulating material 210, the patterned mask layer 202b', and the patterned pad layer 202a' are removed to expose the first semiconductor fins 208a and the second semiconductor fins 208b. These layers may be removed by, for example, a chemical mechanical polish (CMP) process and/or a wet etching process. In some embodiments, after the insulating material 210 is polished, top surfaces of the polished insulating material 210' is substantially coplanar with top surfaces T1 of the first semiconductor fins 208a and top surfaces T2 of the second semiconductor fins 208b.

FIG. 1E is a perspective view illustrating one of various stages of a method of manufacturing a semiconductor device 10 in accordance with some embodiments of the present disclosure. FIG. 2E is a cross-sectional view of the semiconductor device 10 taken along line I-I' and II-II'. Referring to FIG. 1E and FIG. 2E, the polished insulating material 210' filled in the trenches 206 is partially removed by an etching process to form a plurality of first insulators 210a in the first region R1 and a plurality of second insulators 210b in the second region R2. In some embodiments, the polished insulating material 210' may be etched off by a wet etching process with hydrofluoric acid (HF) or a dry etching process. As illustrated in FIG. 1E and FIG. 2E, the first semiconductor fins 208a are sandwiched by two adjacent first insulators 210a and the second semiconductor fins 208b are sandwiched by two adjacent second insulators 210b. Top surfaces T3 of the first insulators 210a are lower than the top surfaces T1 of the first semiconductor fins 208a. Similarly, top surfaces T4 of the second insulators 210b are lower than the top surfaces T2 of the second semiconductor fins 208b. For example, the first semiconductor fins 208a protrude from the top surfaces T3 of the first insulators 210a and the second semiconductor fins 208b protrude from the top surfaces T4 of the second insulators 210b. In some embodiments, a height difference between the top surfaces T1 of the first semiconductor fins 208a and the top surfaces T3 of the first insulators 210a and a height difference between the top surfaces T2 of the second semiconductor fins 208b and the top surfaces T4 of the second insulators 210b respectively ranges from about 15 nm to about 50 nm.

Figure 2A:
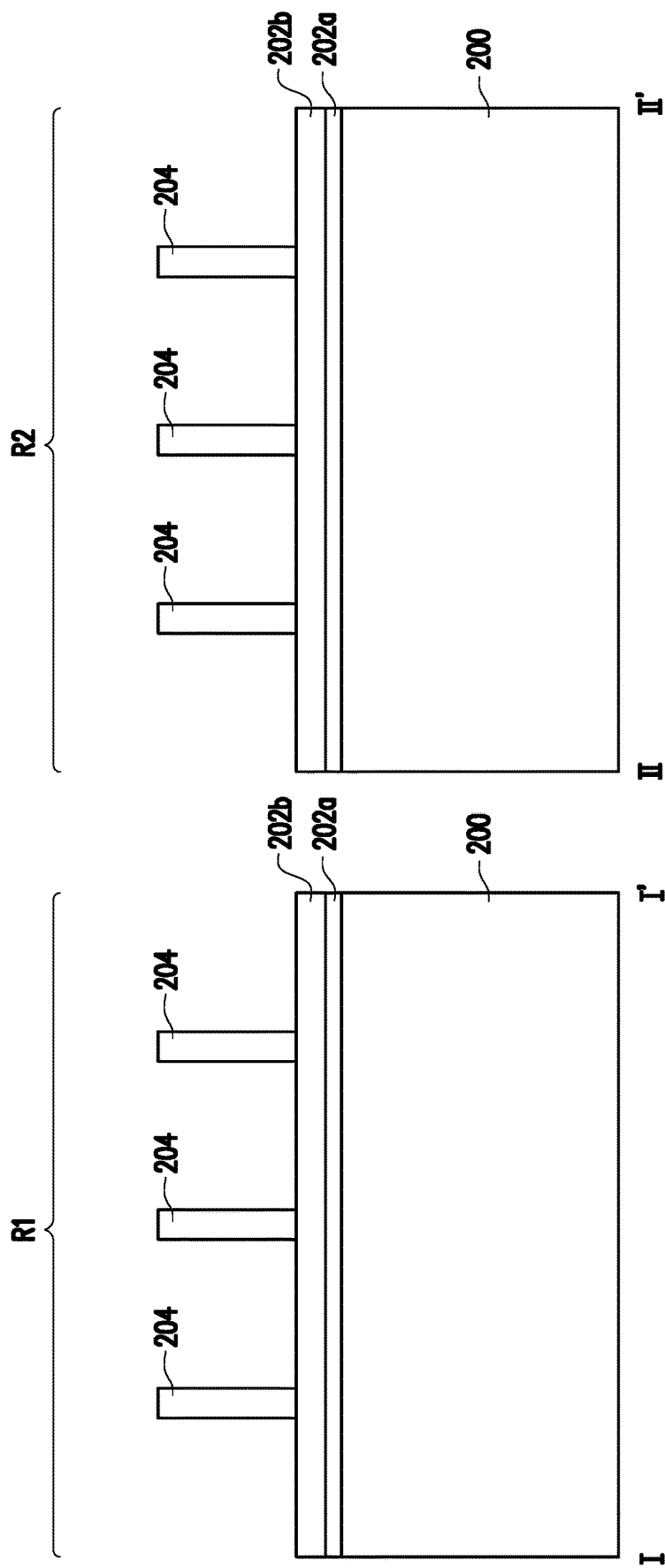
FIG. 2A to FIG. 2N are cross-sectional views illustrating various stages of a method of manufacturing the semiconductor device in FIG. 1A to FIG. 1N.
Figure 2B:
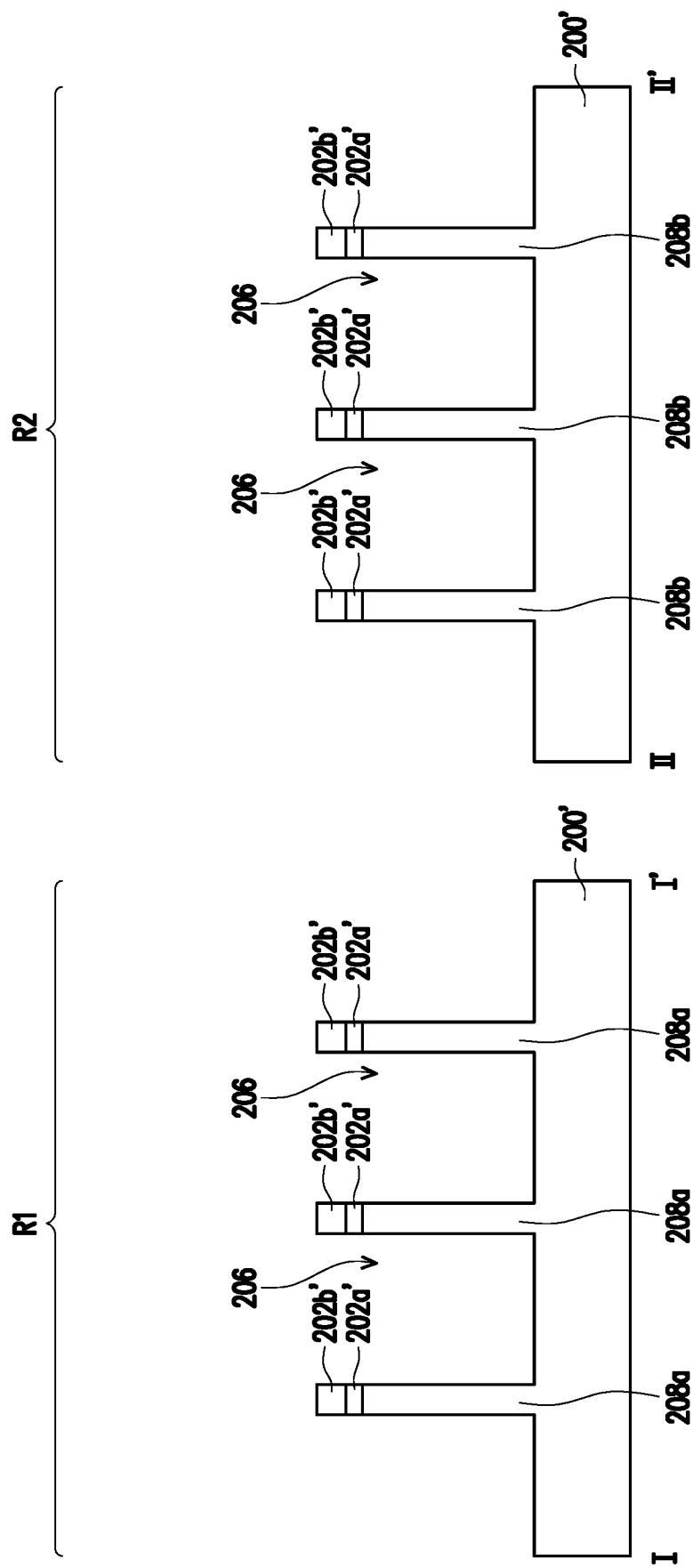
Figure 2C:
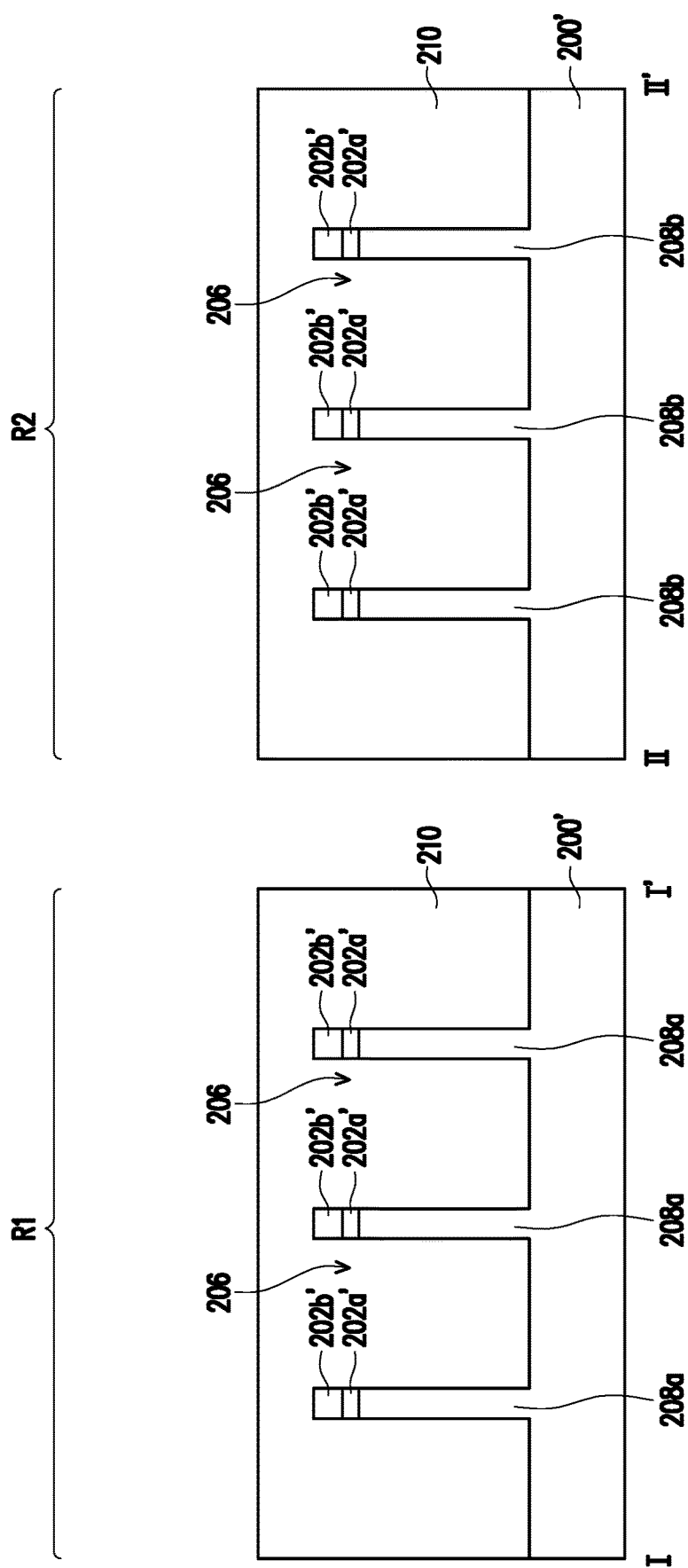
Figure 2D:
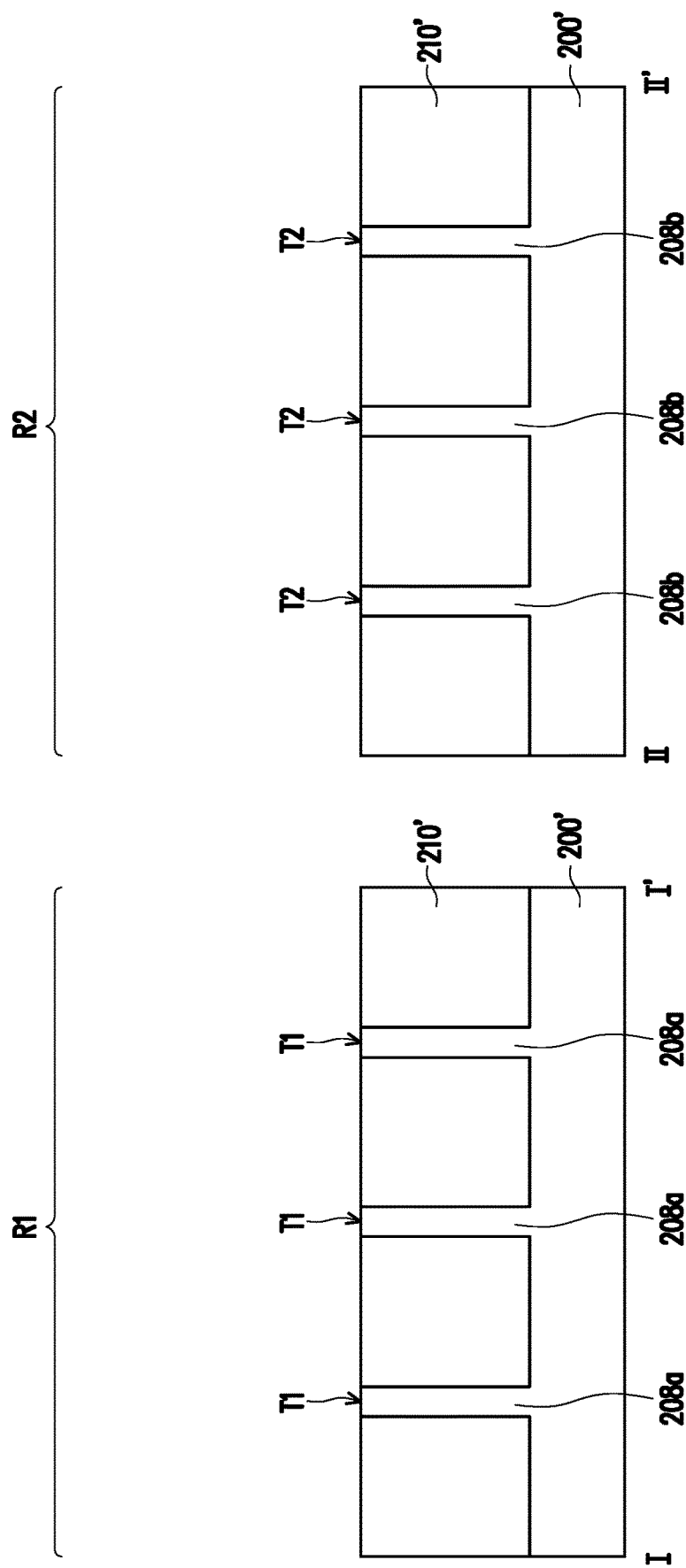
Figure 2E:
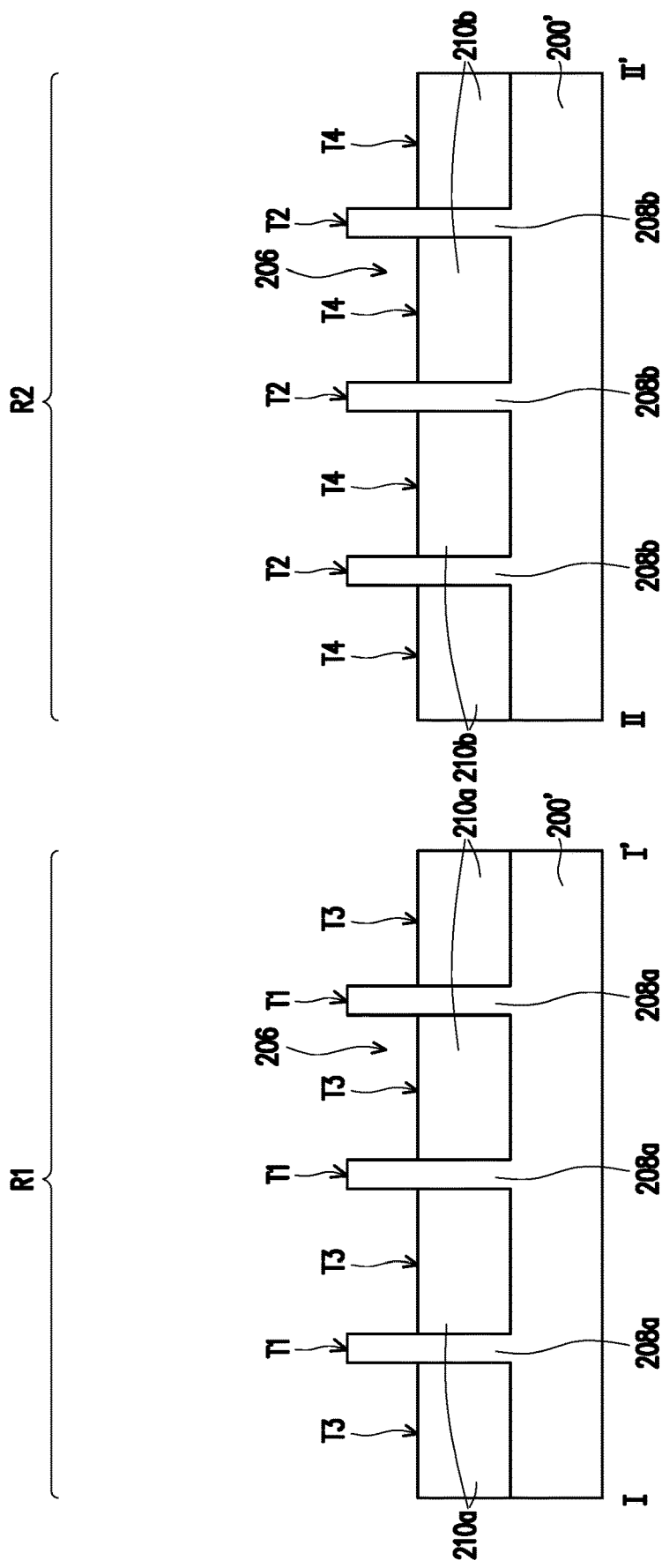
Figure 2F:
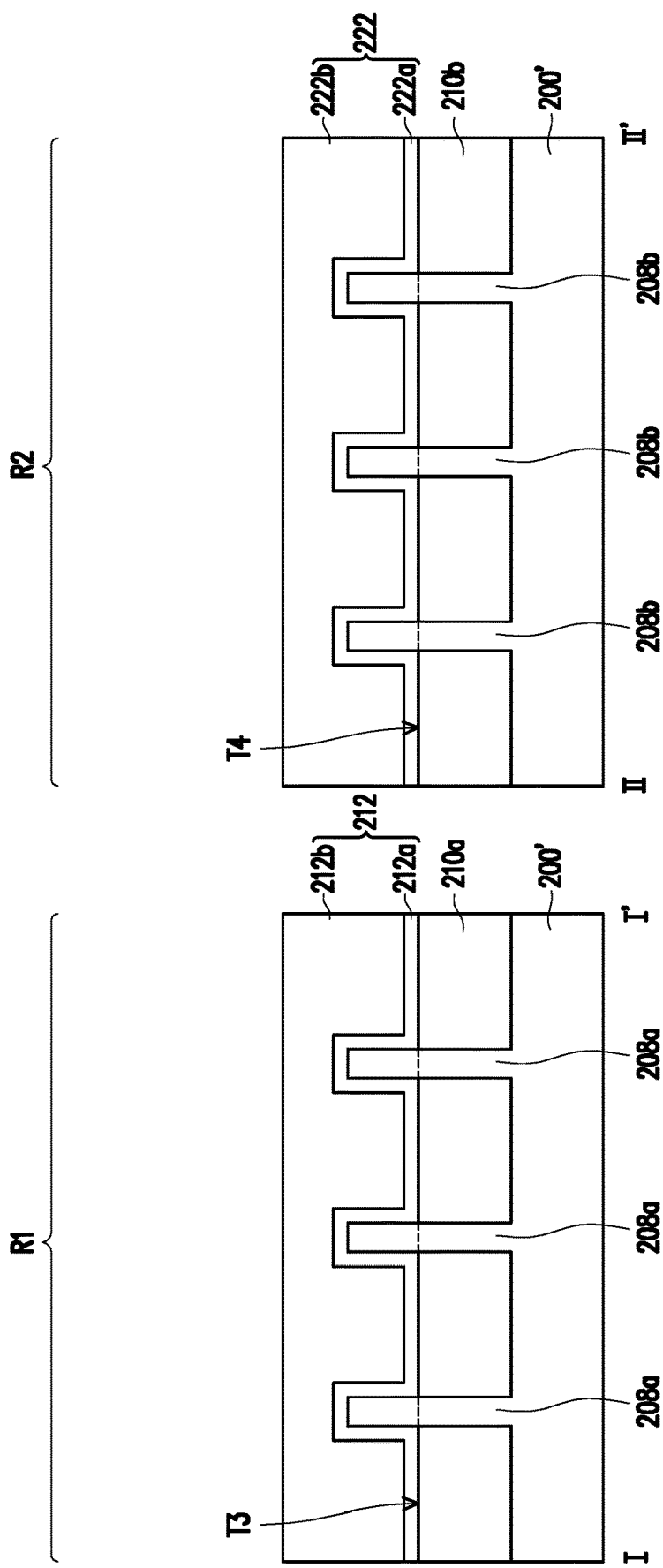

FIG. 1F is a perspective view illustrating one of various stages of a method of manufacturing a semiconductor device 10 in accordance with some embodiments of the present disclosure. FIG. 2F is a cross-sectional view of the semiconductor device 10 taken along line I-I' and II-II'. Referring to FIG. 1F and FIG. 2F, a first dummy gate stack 212 is formed over a portion of the first semiconductor fins 208a and a portion of the first insulators 210a. Similarly, a second dummy gate stack 222 is formed over a portion of the second semiconductor fins 208b and a portion of the second insulators 210b. In some embodiments, an extending direction D1 of the first dummy gate stack 212 and the second dummy gate stack 222 is, for example, perpendicular to an extending direction D2 of the first semiconductor fins 208a and the second semiconductor fins 208b. In some embodiments, the first dummy gate stack 212 and the second dummy gate stack 222 respectively covers a central portion of the first semiconductor fins 208a and the second semiconductor fins 208b. Meanwhile, the two terminals of the first semiconductor fins 208a and the two terminals of the second semiconductor fins 208b are revealed by the first dummy gate stack 212 and the second dummy gate stack 222.

In some embodiments, the first dummy gate stack 212 includes a first dummy gate dielectric layer 212a, a first dummy gate electrode 212b, and a pair of first spacers 212c. In some embodiments, the first dummy gate dielectric layer 212a is conformally formed over a portion of the first insulators 210a and a portion of the first semiconductor fins 208a. In some embodiments, the first dummy gate dielectric layer 212a may include silicon oxide, silicon nitride, or silicon oxy-nitride. The first dummy gate dielectric layer 212a may be formed using a suitable process such as atomic layer deposition (ALD), chemical vapor deposition (CVD), physical vapor deposition (PVD), thermal oxidation, UV-ozone oxidation, or a combination thereof. The first dummy gate dielectric layer 212a may be formed to separate the first semiconductor fins 208a and the first dummy gate electrode 212b and to function as an etching stop layer.

As illustrated in FIG. 1F and FIG. 2F, the first dummy gate electrode 212b is formed on the first dummy gate dielectric layer 212a. In some embodiments, the first dummy gate electrode 212b may be a single-layered structure or a multi-layered structure. In some embodiments, the first dummy gate electrode 212b includes a silicon-containing material, such as poly-silicon, amorphous silicon or a combination thereof. The first dummy gate electrode 212b may be formed by a suitable process such as ALD, CVD, PVD, plating, or a combination thereof. The pair of first spacers 212c is disposed on sidewalls of the first dummy gate dielectric layer 212a and the first dummy gate electrode 212b. In some embodiments, the first spacers 212c further cover a portion of the first semiconductor fins 208a. In some embodiments, the first spacers 212c are formed of dielectric materials, such as silicon oxide, silicon nitride, carbonized silicon nitride (SiCN), SiCON, or a combination thereof. The first spacers 212c may be a single-layered structure or a multi-layered structure.

In some embodiments, the second dummy gate stack 222 includes a second dummy gate dielectric layer 222a, a second dummy gate electrode 222b, and a pair of second spacers 222c. The configurations, the materials, and the formation processes of the second dummy gate dielectric layer 222a, the second dummy gate electrode 222b, and the second spacers 222c may be similar to that of the first dummy gate dielectric layer 212a, the first dummy gate electrode 212b, and the first spacers 212c, so detailed descriptions thereof are omitted herein.

Figure 1G:
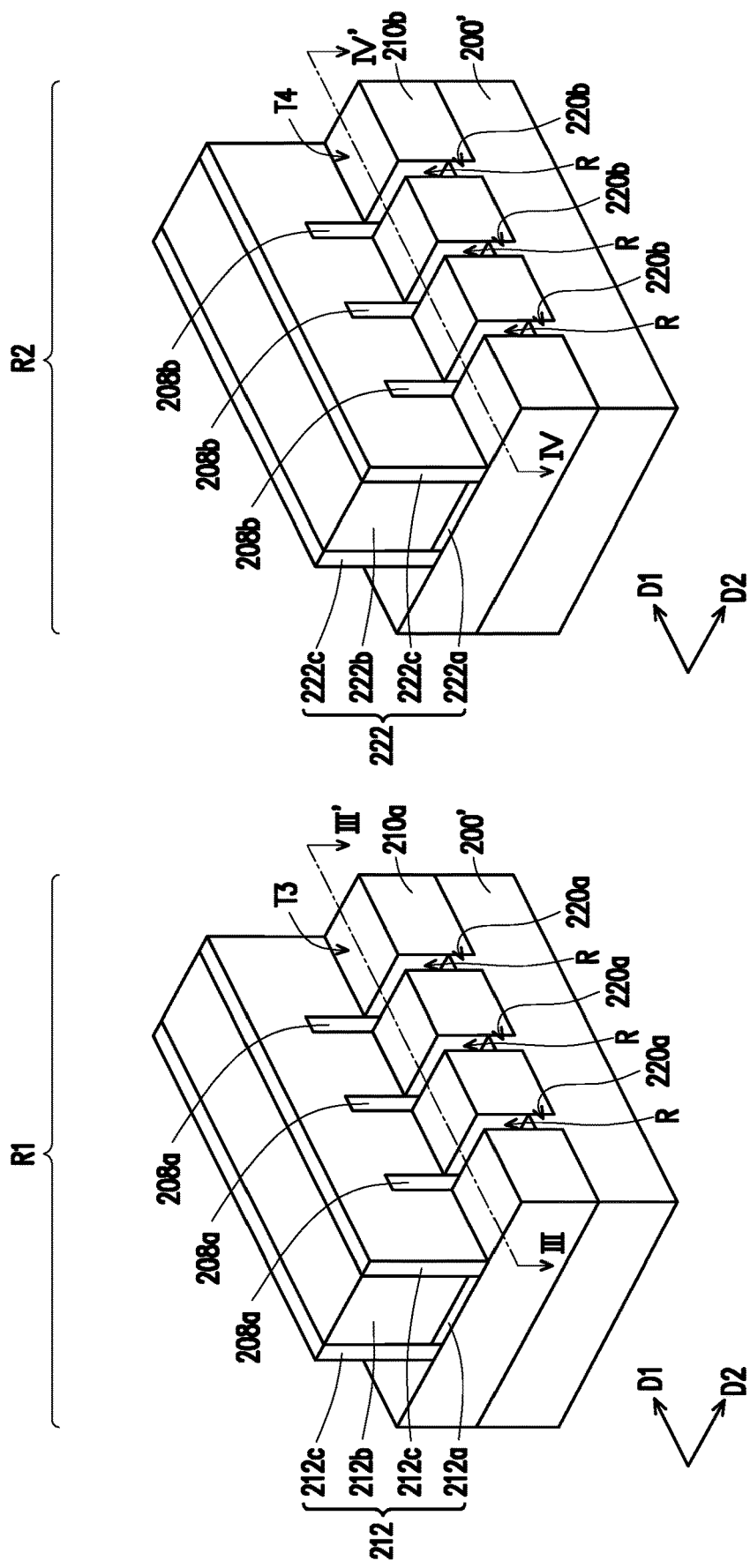
Figure 2G:
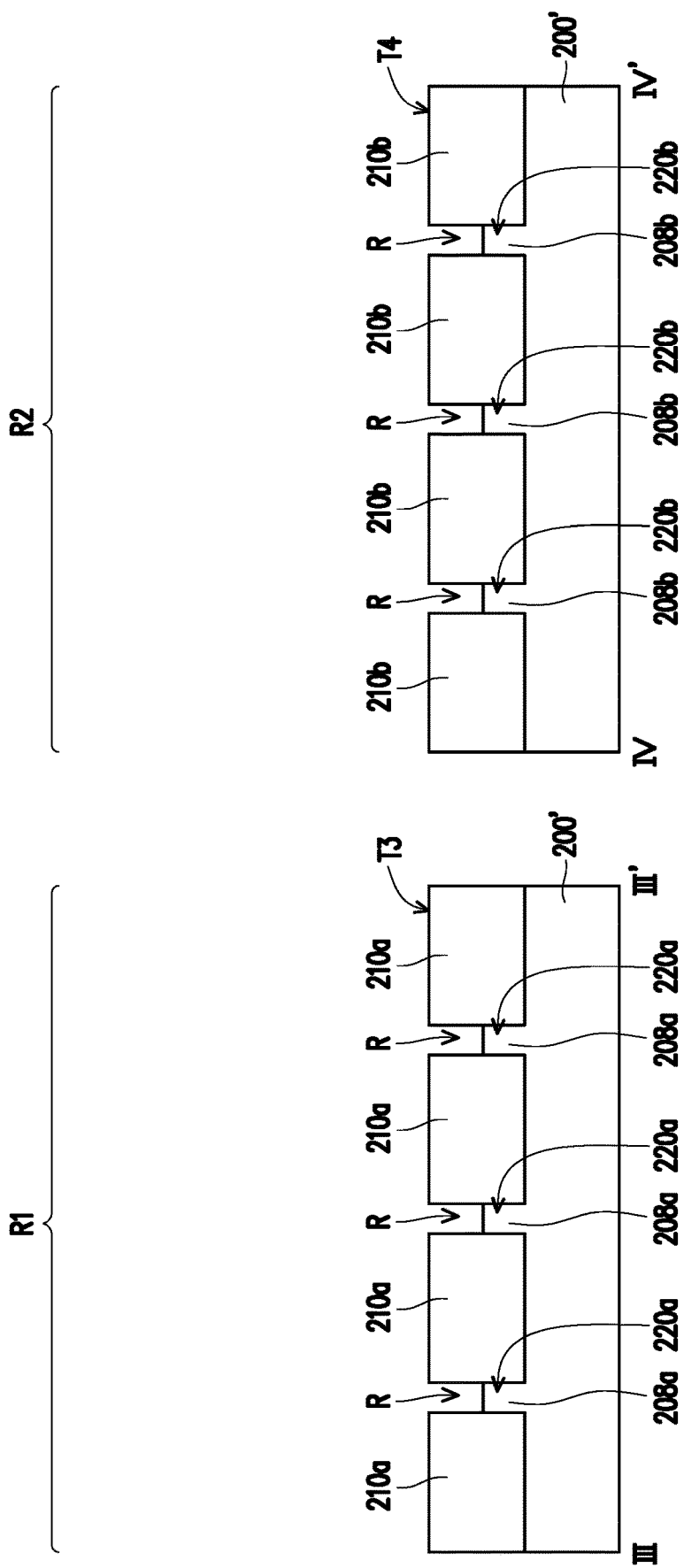

FIG. 1G is a perspective view illustrating one of various stages of a method of manufacturing a semiconductor device 10 in accordance with some embodiments of the present disclosure. FIG. 2G is a cross-sectional view of the semiconductor device 10 taken along line III-III' and IV-IV'. Referring to FIG. 1G and FIG. 2G, the first semiconductor fins 208a and the second semiconductor fins 208b exposed by the first dummy gate stack 212 and the second dummy gate stack 222 are removed/recessed to form a plurality of recessed portions R. Portions of the first semiconductor fins 208a and portions of the second semiconductor fins 208b may be removed by, for example, anisotropic etching, isotropic etching, or a combination thereof. In some embodiments, portions of the first semiconductor fins 208a and portions of the second semiconductor fins 208b are respectively recessed below the top surfaces T3 of the first insulators 210a and the top surfaces T4 of the second insulators 210b. In some embodiments, a depth of the recessed portions R is less than a thickness of the first insulators 210a and a thickness of the second insulators 210b. In other words, the first semiconductor fins 208a and the second semiconductor fins 208b exposed by the first dummy gate stack 212 and the second dummy gate stack 222 are not entirely removed, and the remaining first and second semiconductor fins 208a, 208b located in the recessed portion R respectively constitute source/drain regions 220a, 220b. As illustrated in FIG. 1G and FIG. 2G, the first semiconductor fins 208a and the second semiconductor fins 208b covered by the first dummy gate stack 212 and the second dummy gate stack 222 are exposed at sidewalls of the first dummy gate stack 212 and the second dummy gate stack 222.

Figure 2H:
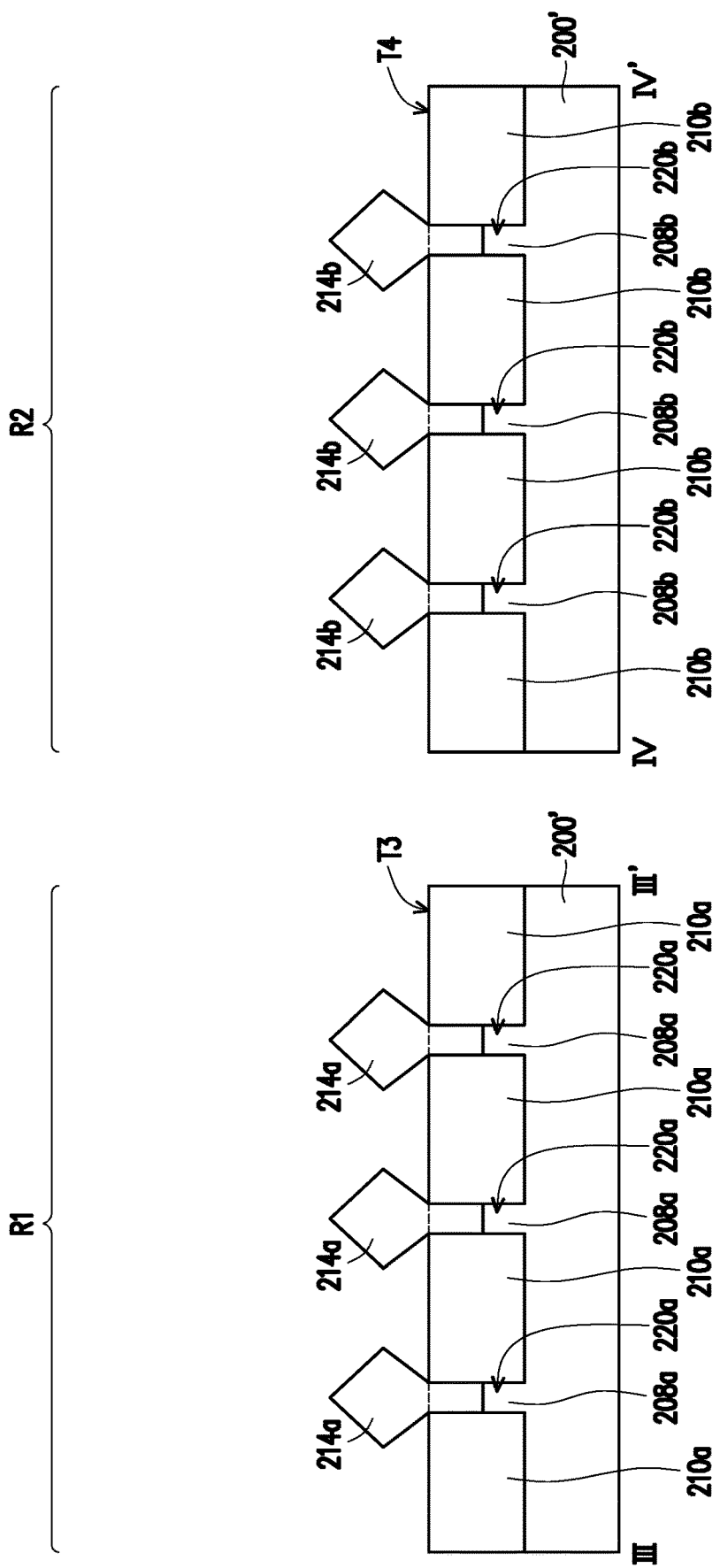

FIG. 1H is a perspective view illustrating one of various stages of a method of manufacturing a semiconductor device 10 in accordance with some embodiments of the present disclosure. FIG. 2H is a cross-sectional view of the semiconductor device 10 taken along line III-III' and IV-IV'. Referring to FIG. 1H and FIG. 2H, a first S/D 214a (or a highly doped low resistance material) is grown over the recessed portions R of the first semiconductor fins 208a and extends beyond the top surfaces T3 of the first insulators 210a. In some embodiments, an example of the first S/D 214a may include a strained material to strain or stress the first semiconductor fins 208a. In some embodiments, the first S/D 214a is formed over the source/drain regions 220a of the first semiconductor fins 208a. Similarly, a second S/D 214b (or a highly doped low resistance material) is also grown over the recessed portion R of the second semiconductor fins 208b and extends beyond the top surfaces T4 of the second insulators 210b. In some embodiments, an example of the second S/D 214b may include a strained material to strain or stress the second semiconductor fins 208b. In some embodiments, the second S/D 214b is formed over the source/drain regions 220b of the second semiconductor fins 208b. Thus, the first S/D 214a and the second S/D 214*b* respectively includes a source disposed at a side of the first dummy stack gate 212 or the second dummy stack gate 222 and a drain disposed at the other side of the first dummy gate stack 212 or the second dummy stack gate 222. The source covers a terminal of the first semiconductor fins 208*a* or the second semiconductor fins 208*b* and the drain covers the other terminal of the first semiconductor fins 208*a* or the second semiconductor fins 208*b*.

In some embodiments, the first S/D 214*a* and the second S/D 214*b* may be doped with a conductive dopant. In some embodiments, the first S/D 214*a* and the second S/D 214*b*, such as SiGe, is epitaxial-grown with p-type dopants for straining a p-type FinFET. That is, the first S/D 214*a* and the second S/D 214*b* are doped with the p-type dopants to be the source and the drain of the p-type FinFET. The p-type dopants include boron or $BF_2$. In some alternative embodiments, the first S/D 214*a* and the second S/D 214*b*, such as SiC, SiP, a combination of SiC/SiP, or SiCP is epitaxial-grown with n-type dopants for straining an n-type FinFET. That is, the first S/D 214*a* and the second S/D 214*b* are doped with the n-type dopants to be the source and the drain of the n-type FinFET. The n-type dopants include arsenic and/or phosphorus. In some embodiments, the first S/D 214*a* and the second S/D 214*b* may be epitaxial-grown by LPCVD process with in-situ doping.

In some embodiments, the first S/D 214*a* and the second S/D 214*b* may be made of the same material. For example, the first S/D 214*a* and the second S/D 214*b* may be doped with dopants of the same type. In some alternative embodiments, the first S/D 214*a* and the second S/D 214*b* may be made of different materials. For example, the first S/D 214*a* and the second S/D 214*b* may be doped with dopants of different types. In some embodiments, the first S/D 214*a* and the second S/D 214*b* may be a single-layered structure or a multi-layered structure.

It should be noted that the recess step illustrated in FIG. 1G and FIG. 2G may be omitted in some embodiments. For example, the first S/D 214*a* and the second S/D 214*b* may be respectively formed on the un-recessed first and second semiconductor fins 208*a*, 208*b*. That is, the first S/D 214*a* and the second S/D 214*b* may be formed on the source/drain regions 220*a*, 220*b* of the un-recessed first and second semiconductor fins 208*a*, 208*b*.

Figure 1I:
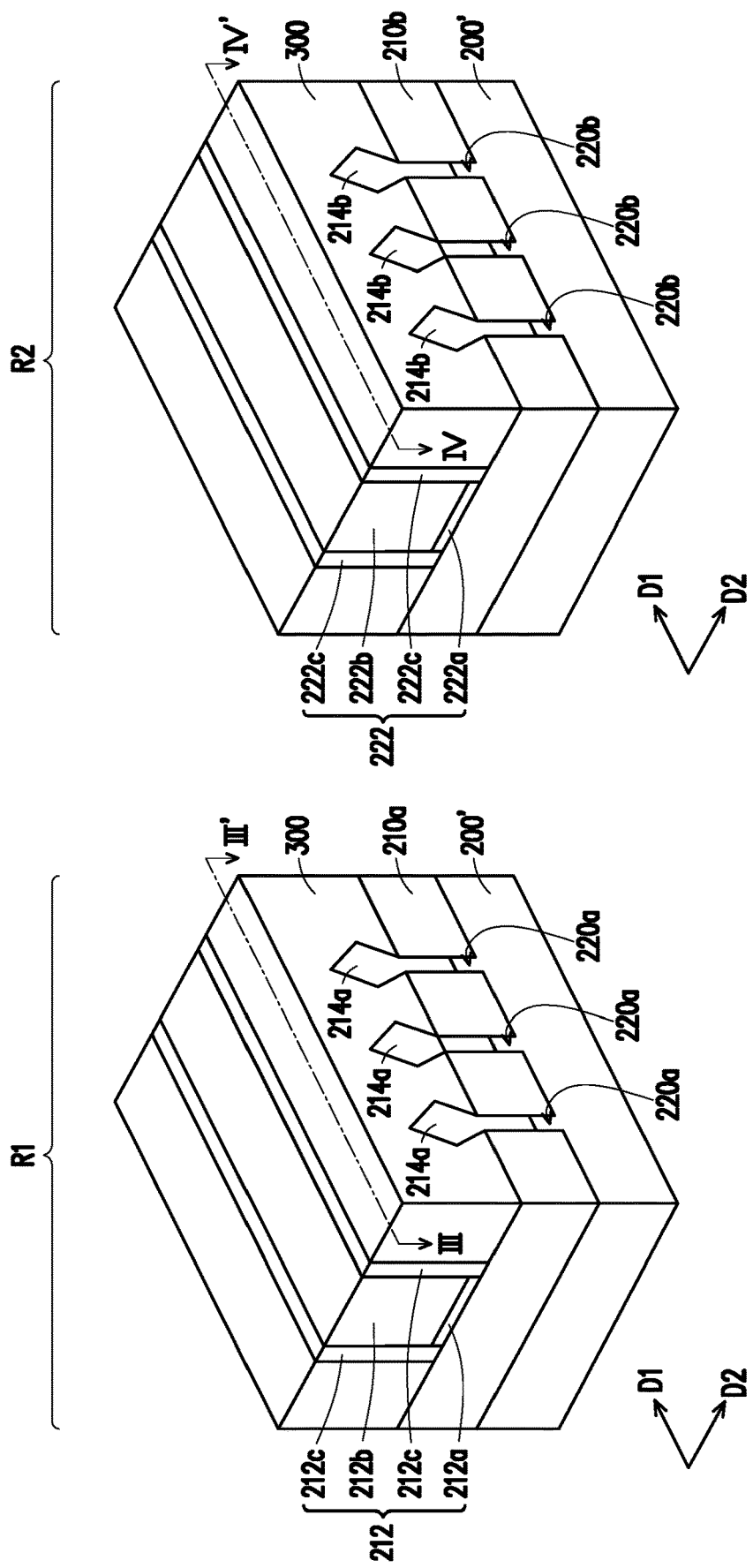
Figure 2I:
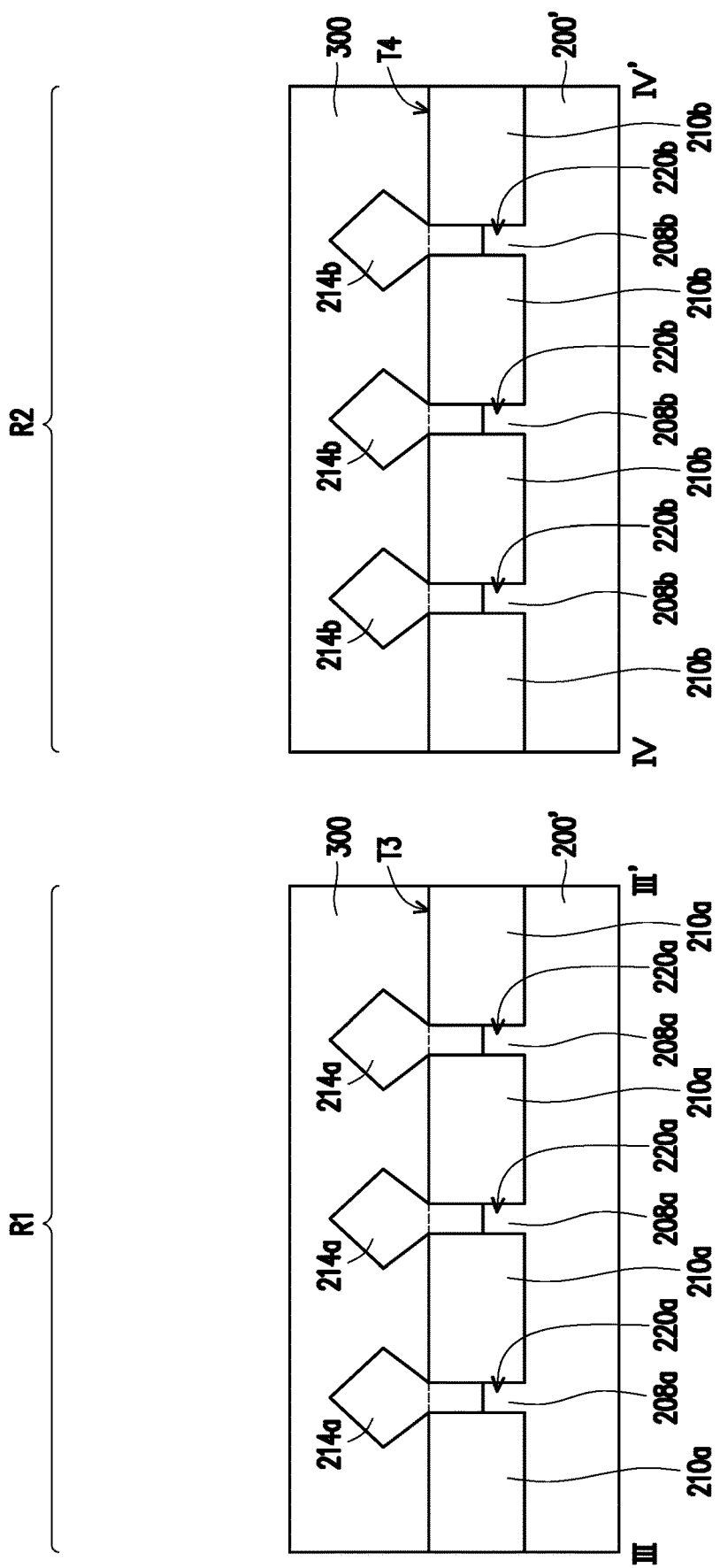

FIG. 1I is a perspective view illustrating one of various stages of a method of manufacturing a semiconductor device 10 in accordance with some embodiments of the present disclosure. FIG. 2I is a cross-sectional view of the semiconductor device 10 taken along line III-III' and IV-IV'. Referring to FIG. 1I and FIG. 2I, an interlayer dielectric layer 300 is formed over the first S/D 214*a*, the second S/D 214*b*, the first insulators 210*a*, and the second insulators 210*b*. For example, the interlayer dielectric layer 300 may be formed adjacent to the first spacers 212*c* and the second spacers 222*c*.

The interlayer dielectric layer 300 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the interlayer dielectric layer 300 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 300 may include one or more dielectric materials and/or one or more dielectric layers. In some embodiments, the interlayer dielectric layer 300 is formed to a suitable thickness by Flowable CVD (FCVD), CVD, HDPCVD, SACVD, spin-on, sputtering, or other suitable methods. For example, an interlayer dielectric material layer (not illustrated) may be formed to cover the first insulators 210*a*, the second insulators 210*b*, the first dummy gate stack 212, and the second dummy gate stack 222. Subsequently, the thickness of the interlayer dielectric material layer is reduced until a top surface of the first dummy gate stack 212 and a top surface of the second dummy gate stack 222 are exposed, so as to form the interlayer dielectric layer 300. The process of reducing the thickness of the interlayer dielectric material layer may be achieved by a chemical mechanical polishing (CMP) process, an etching process, or other suitable processes.

Figure 2J:
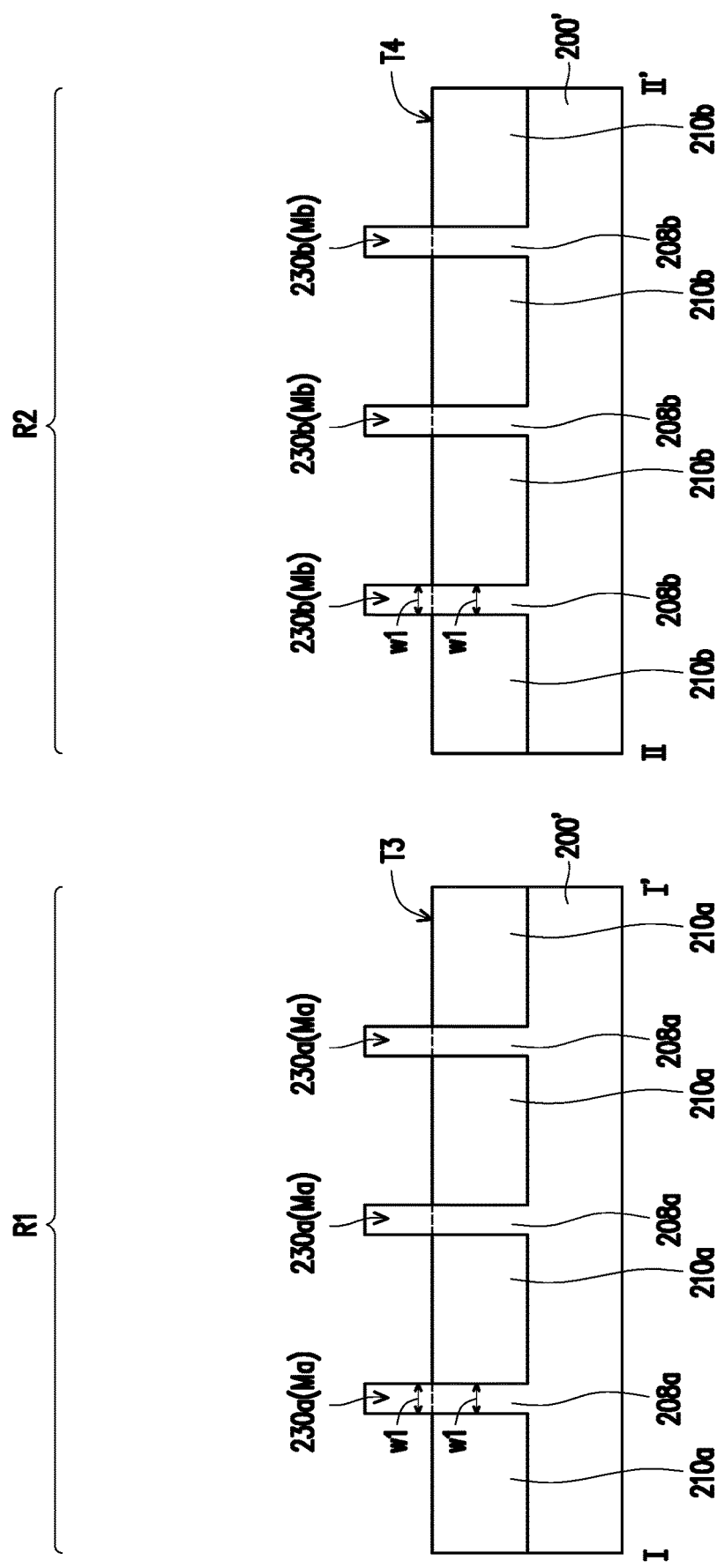

FIG. 1J is a perspective view illustrating one of various stages of a method of manufacturing a semiconductor device 10 in accordance with some embodiments of the present disclosure. FIG. 2J is a cross-sectional view of the semiconductor device 10 taken along line I-I' and II-II'. Referring to FIG. 1J and FIG. 2J, portions of the first dummy gate stack 212 and portions of the second dummy gate stack 222 are removed to form a hollow portion H exposing a middle portion Ma of the first semiconductor fins 208*a* and a middle portion Mb of the second semiconductor fins 208*b*. In some embodiments, the first dummy gate electrode 212*b* and the first dummy gate dielectric layer 212*a* are removed to expose the middle portion Ma of the first semiconductor fins 208*a*. Similarly, the second dummy gate electrode 222*b* and the second dummy gate dielectric layer 222*a* are removed to expose the middle portion Mb of the second semiconductor fins 208*b*. In some embodiments, the middle portion Ma and the middle portion Mb may act as channel regions 230*a*, 230*b*.

In some embodiments, the first dummy gate electrode 212*b*, the second dummy gate electrode 222*b*, the first dummy gate dielectric layer 212*a*, and the second dummy gate dielectric layer 222*a* are removed through an etching process or other suitable processes. The etching process includes, for example, a wet etching process or a dry etching process. Example of the wet etching process includes chemical etching and example of the dry etching process includes plasma etching. However, other commonly known etching method may also be adapted to remove the first dummy gate electrode 212*b*, the second dummy gate electrode 222*b*, the first dummy gate dielectric layer 212*a*, and the second dummy gate dielectric layer 222*a*.

It should be noted that at this stage, each of the first semiconductor fins 208*a* has a substantially uniform width of w1. Similarly, each of the second semiconductor fins 208*b* also has a substantially uniform width of w1. In other words, the width w1 of the first semiconductor fins 208*a* located in the hollow portion H and the width of the first semiconductor fins 208*a* covered by the first spacers 212*c*, the interlayer dielectric layer 300, and the first S/D 214*a* are substantially the same. On the other hand, the width w1 of the second semiconductor fins 208*b* located in the hollow portion H and the width w1 of the second semiconductor fins 208*b* covered by the second spacers 222*c*, the interlayer dielectric layer 300, and the second S/D 214*b* are substantially the same. Although FIG. 1J and FIG. 2J depicted that the first semiconductor fins 208*a* in the first region R1 and the second semiconductor fins 208*b* in the second region have the same width w1, it constitutes no limitation in the present disclosure. In some alternative embodiments, the first semiconductor fins 208a and the second semiconductor fins 208b may have different widths. Nevertheless, each first semiconductor fins 208a and each second semiconductor fins 208b still respectively has a uniform width.

Figure 2K:
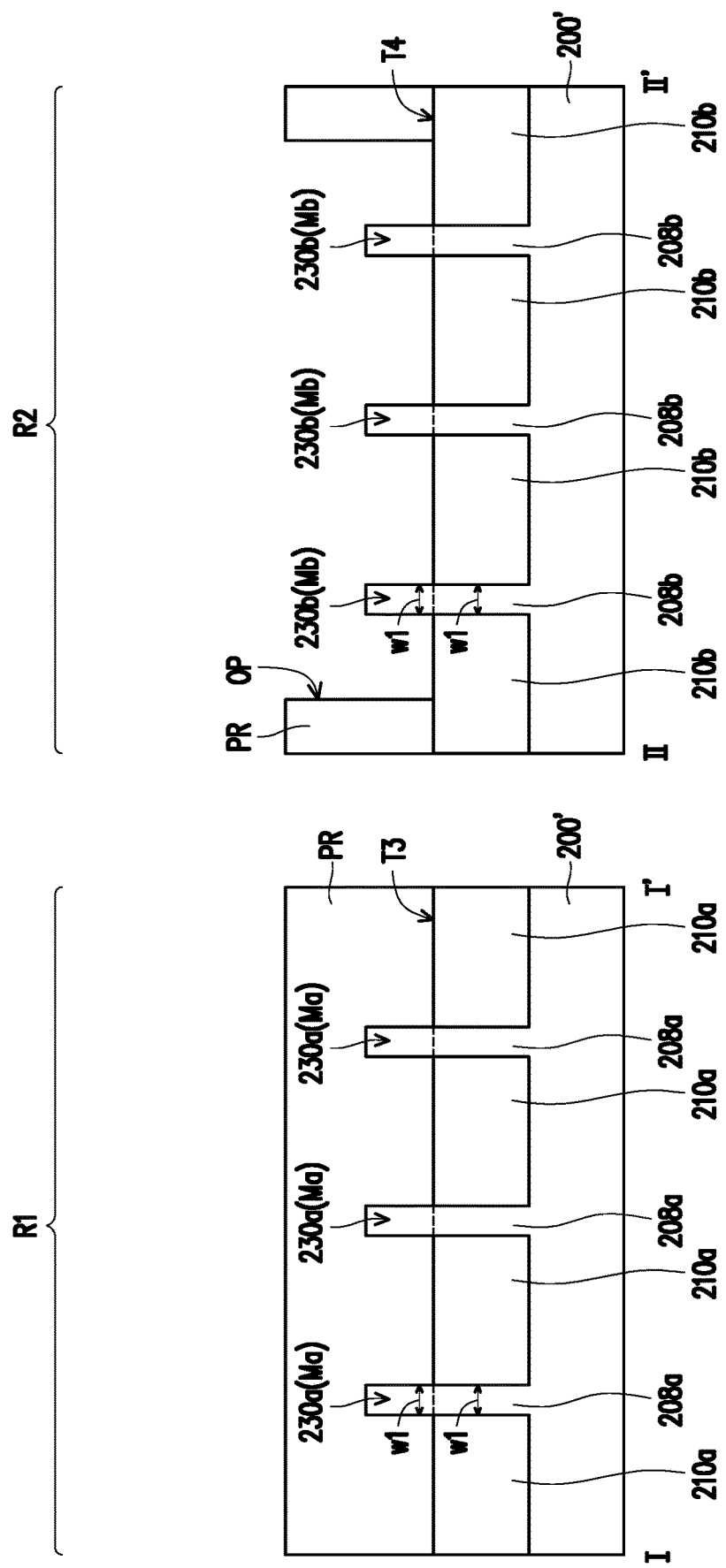

FIG. 1K is a perspective view illustrating one of various stages of a method of manufacturing a semiconductor device 10 in accordance with some embodiments of the present disclosure. FIG. 2K is a cross-sectional view of the semiconductor device 10 taken along line I-I' and II-II'. Referring to FIG. 1K and FIG. 2K, a photoresist layer PR is formed over the interlayer dielectric layer 300. In the first region R1, the photoresist layer PR fills into the hollow portion H and completely covers the middle portion Ma of the first semiconductor fins 208a. On the other hand, in the second region R2, the photoresist layer PR has an opening OP exposing the middle portion Mb of the second semiconductor fins 208b located in the hollow portion H. The opening OP of the photoresist layer PR may be formed by a photolithography process and an etching process performed on the photoresist layer PR. In some embodiments, the photoresist layer PR is made of photosensitive materials. For example, the photoresist layer PR may be a chemically amplified resist that employs acid catalysis. In some embodiments, the photoresist layer PR may be formulated by dissolving an acid sensitive polymer in a casting solution.

Figure 2L:
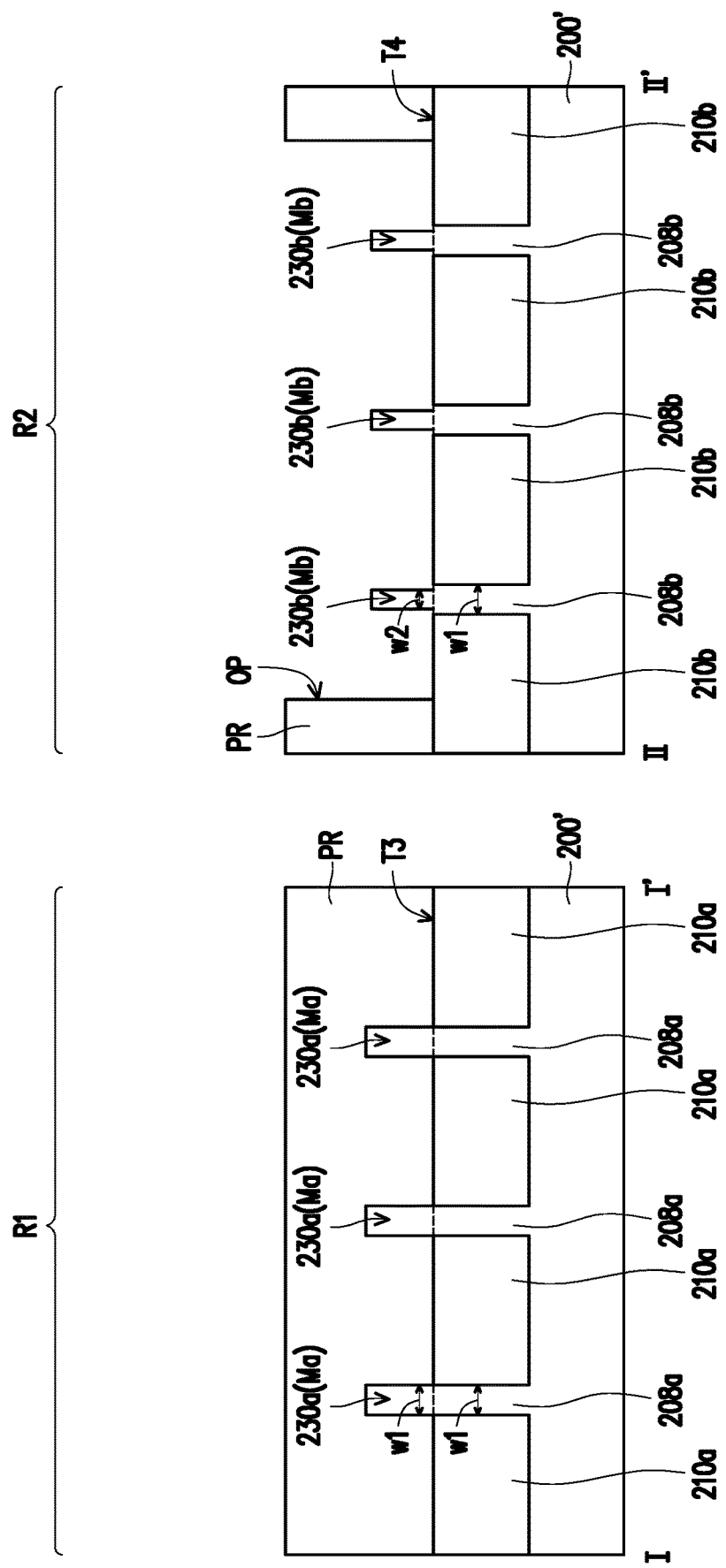

FIG. 1L is a perspective view illustrating one of various stages of a method of manufacturing a semiconductor device 10 in accordance with some embodiments of the present disclosure. FIG. 2L is a cross-sectional view of the semiconductor device 10 taken along line I-I' and II-II'. Referring to FIG. 1L and FIG. 2L, part of the middle portion Mb of the second semiconductor fins 208b is removed such that the widths w1 of the middle portion Mb of the second semiconductor fins 208b are reduced. In some embodiments, the heights of the middle portion Mb of the second semiconductor fins 208b are also reduced. In some embodiments, the widths and the heights of the middle portion Mb of the second semiconductor fins 208b may be reduced by performing an etching process. For example, the etching process for forming the first semiconductor fins 208a and the second semiconductor fins 208b as illustrated in FIG. 1B and FIG. 2B may be repeated on the middle portion Mb of the second semiconductor fins 208b. In some embodiments, the etching process includes a dry etching process using HBr, $CF_4$, or a combination thereof. In some embodiments, a reduction ratio of the width of the second semiconductor fins 208b ranges between 5% and 15% and a reduction ratio of the height of the second semiconductor fins 208b ranges between 5% and 15%. Referring to FIG. 1L and FIG. 2L, since the first semiconductor fins 208a is well protected by the first S/D 214a, the interlayer dielectric layer 300, the first spacers 212c, and the photoresist layer PR, the etching process is not performed on the first semiconductor fins 208a located in the first region R1. Therefore, each first semiconductor fin 208a still has uniform width. On the other hand, since the second semiconductor fins 208b located in the second region R2 are partially shielded and partially exposed, the exposed portion is subjected to the etching process to render a smaller width w2. In other words, the width w2 of the channel region 230b (the middle portion Mb) of the second semiconductor fins 208b is smaller than width w1 of the source/drain regions 220b of the second semiconductor fins 208b.

Figure 2M:
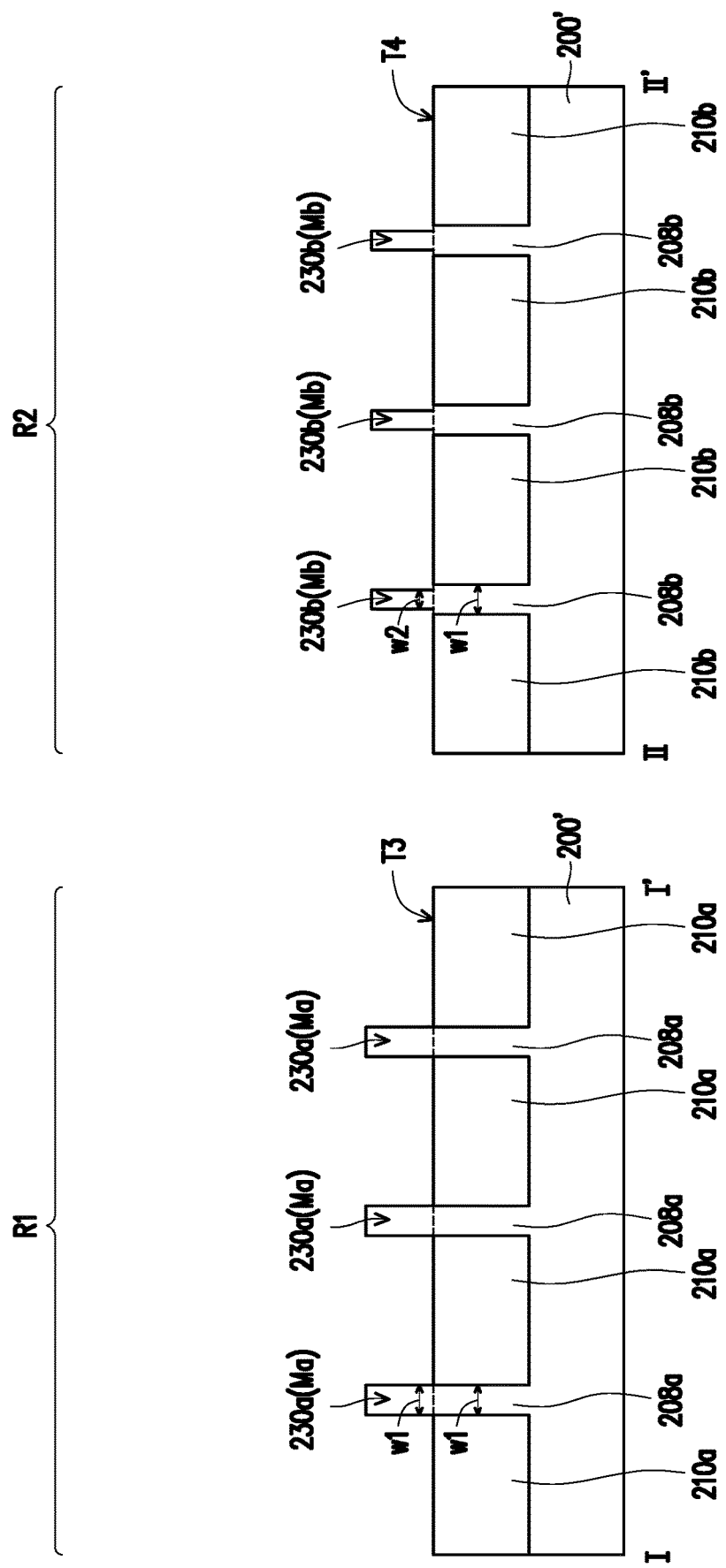

FIG. 1M is a perspective view illustrating one of various stages of a method of manufacturing a semiconductor device 10 in accordance with some embodiments of the present disclosure. FIG. 2M is a cross-sectional view of the semiconductor device 10 taken along line I-I' and II-II'. Referring to FIG. 1M and FIG. 2M, the photoresist layer PR is removed. In some embodiments, the photoresist layer PR may be removed/stripped through, for example, an etching process, an ashing process, or other suitable removal processes.

Figure 1N:
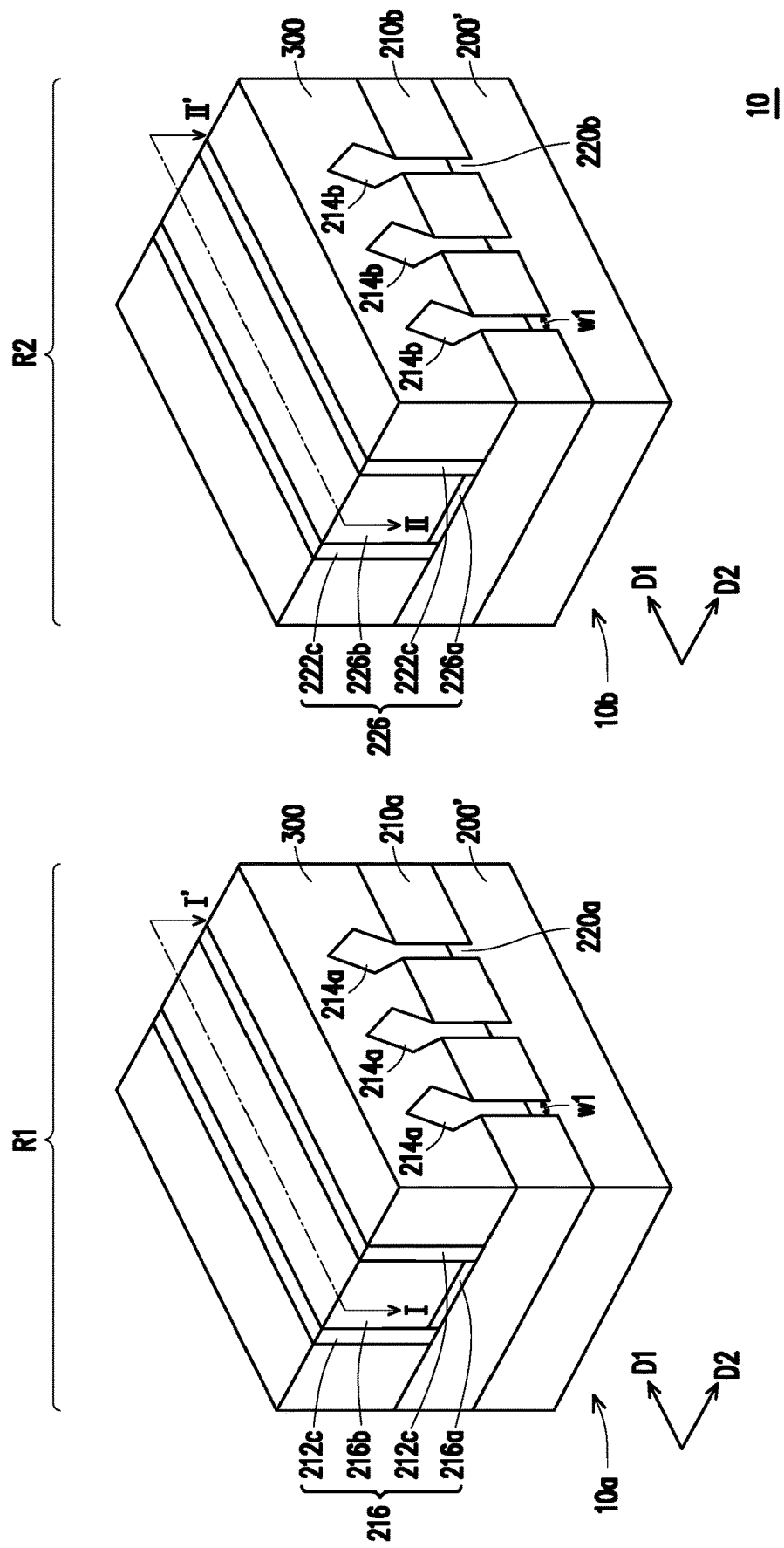
Figure 2N:
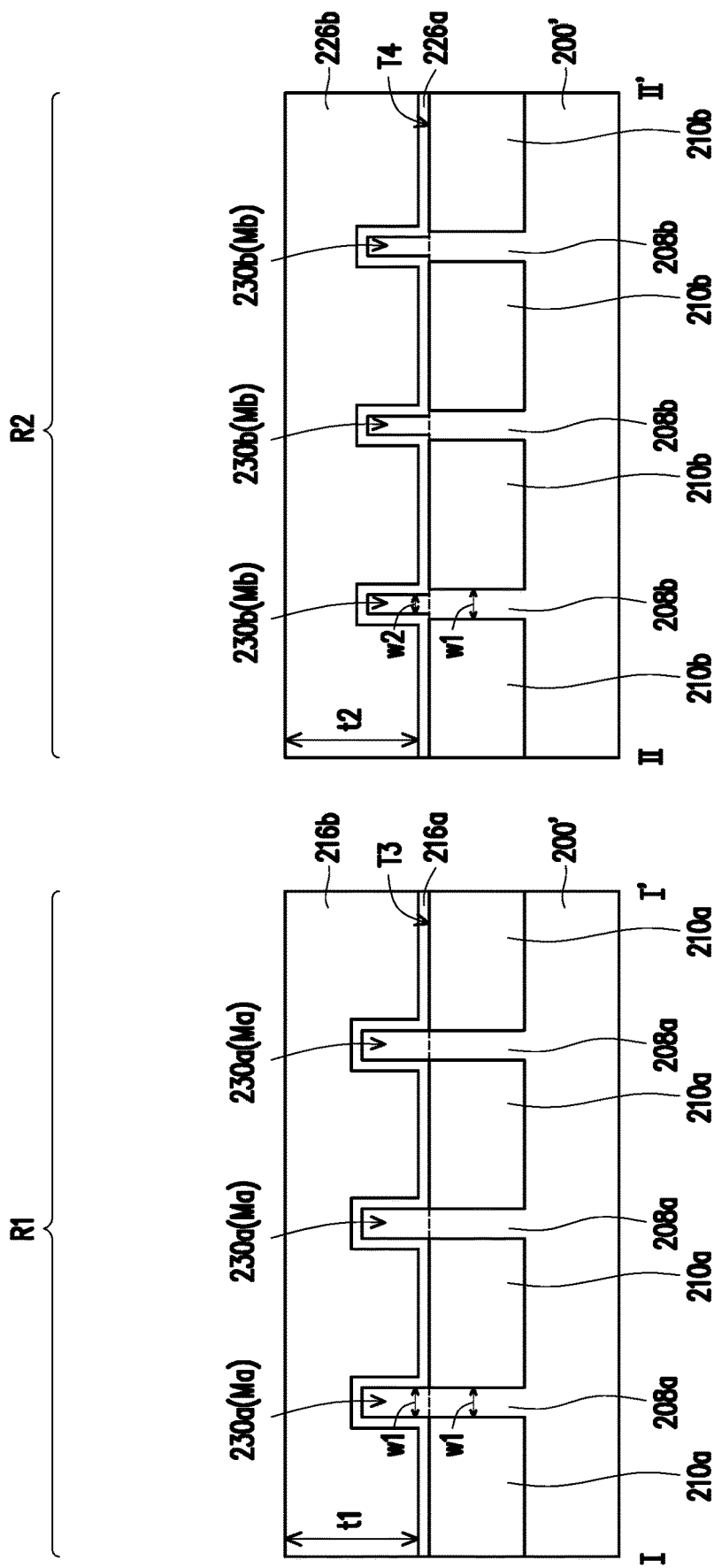

FIG. 1N is a perspective view illustrating one of various stages of a method of manufacturing a semiconductor device 10 in accordance with some embodiments of the present disclosure. FIG. 2N is a cross-sectional view of the semiconductor device 10 taken along line I-I' and II-II'. Referring to FIG. 1N and FIG. 2N, a gate dielectric material and a gate material are filled into the hollow portion H to form a first gate stack 216 over the first semiconductor fins 208a in the first region R1 and a second gate stack 226 over the second semiconductor fins 208b in the second region R2. At this stage, the fabrication process of a first fin field effect transistor (FinFET) 10a and a second FinFET 10b is substantially completed. In some embodiments, the first FinFET 10a located in the first region R1 and the second FinFET 10b located in the second region R2 may be configured to perform different applications.

In some embodiments, the first gate stack 216 includes a first gate dielectric layer 216a, a first gate electrode 216b, and the first spacers 212c. The first gate dielectric layer 216a is disposed over the channel region 230a of the first semiconductor fin 208a, the first gate electrode 216b is disposed over the first gate dielectric layer 216a, and the first spacers 212c are disposed on sidewalls of the first gate dielectric layer 216a and the first gate electrode 216b. A material of the first gate dielectric layer 216a may be identical to or different from the material of the first dummy gate dielectric layer 212a. For example, the first gate dielectric layer 216a includes silicon oxide, silicon nitride, silicon oxy-nitride, high-k dielectric materials, or a combination thereof. High-k dielectric materials include metal oxides such as oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the first gate dielectric layer 216a has a thickness in the range of about 10 to 30 angstroms. The first gate dielectric layer 216a is formed using a suitable process such as ALD, CVD, PVD, FCVD, thermal oxidation, UV-ozone oxidation, or a combination thereof. The first gate dielectric layer 216a may further include an interfacial layer (not shown). For example, the interfacial layer may be used in order to create a good interface between the first semiconductor fins 208a and the first gate electrode 216b, as well as to suppress the mobility degradation of the channel carrier of the semiconductor device 10. Moreover, the interfacial layer is formed by a thermal oxidation process, a CVD process, or an ALD process. A material of the interfacial layer includes a dielectric material, such as a silicon oxide layer or a silicon oxynitride layer.

In some embodiments, the first gate electrode 216b is aligned with the channel region 230a of the first semiconductor fins 208a. In some embodiments, a material of the first gate electrode 216b includes metal, metal alloy, or metal nitride. For example, in some embodiments, the first gate electrode 216b may include TiN, WN, TaN, Ru, Ti, Ag, Al, TiAl, TiAlN, TaC, TaCN, TaSiN, Mn, or Zr. Moreover, the first gate electrode 216b may further include a barrier layer, a work function layer, or a combination thereof. As mentioned above, an interfacial layer may be included between the first gate electrode 216b and the first semiconductor fins 208a, but it constitutes no limitation to the present disclosure. In some alternative embodiments, a liner layer, a seed layer, an adhesion layer, or a combination thereof may also be included between the first gate electrode 216b and the first semiconductor fins 208a.

In some embodiments, the second dummy gate stack 226 includes a second gate dielectric layer 226a, a second gate electrode 226b, and the second spacers 222c. In some embodiments, the second gate electrode 226b is aligned with the channel region 230b of the second semiconductor fin 208b. In some embodiments, the second gate electrode 226b is in contact with side surfaces of the source/drain regions 220b of the second semiconductor fins 208b when the first and second semiconductor fins 208a, 208b are un-recessed. The configurations, the materials, and the formation processes of the second gate dielectric layer 226a and the second gate electrode 226b may be similar to that of the first gate dielectric layer 216a and the first gate electrode 216b, so detailed descriptions thereof are omitted herein. Nevertheless, as mentioned above, since the first FinFET 10a and the second FinFET 10b may perform different applications, the active current and the operation voltage of the first FinFET 10a and the second FinFET 10b may be different from each other. In some embodiments, the difference may be realized by adjusting a thickness of the gate electrodes. For example, the work function layer in the first gate electrode 216b and the work function layer in the second gate electrode 226b may have different thicknesses. As such, in some embodiments, a thickness t1 of the first gate electrode 216b and a thickness t2 of the second gate electrode 226b may be different from each other. However, the foregoing configuration constitutes no limitation in the present disclosure. As mentioned above, the dopant concentration difference between the first semiconductor fins 208a and the second semiconductor fins 208b may also be adapted for realizing different applications in different regions. Therefore, when the dopant concentration in the first semiconductor fins 208a is different from the dopant concentration in the second semiconductor fins 208b, the thickness 1 of the first gate electrode 216b and the thickness t2 of the second gate electrode 226b may be substantially equal to each other.

The process illustrated in FIG. 1I to FIG. 1J, FIG. 1N, FIG. 2I to FIG. 2J, and FIG. 2N is commonly referred to as the metal gate replacement process. In some embodiments, the first dummy gate stack 212 and the second dummy gate stack 222 including polysilicon are replaced by the first gate stack 216 and the second gate stack 226 including metal. Since the first dummy gate stack 212 and the second dummy gate stack 222 are being replaced by the first gate stack 216 and the second gate stack 226 respectively, subsequent processes of forming metallic interconnection (not illustrated) may be implemented. For example, other conductive lines (not illustrated) are formed to electrically connect the first gate electrode 216b and the second gate electrode 226b with other elements in the semiconductor device 10.

It should be noted that although FIG. 1A to FIG. 1N illustrated that the first FinFET 10a and the second FinFET 10b are simultaneously formed, the present disclosure is not limited thereto. In some alternative embodiments, the fabrication processes of the first FinFET 10a and the second FinFET 10b may be performed individually during different stages.

Figure 4:
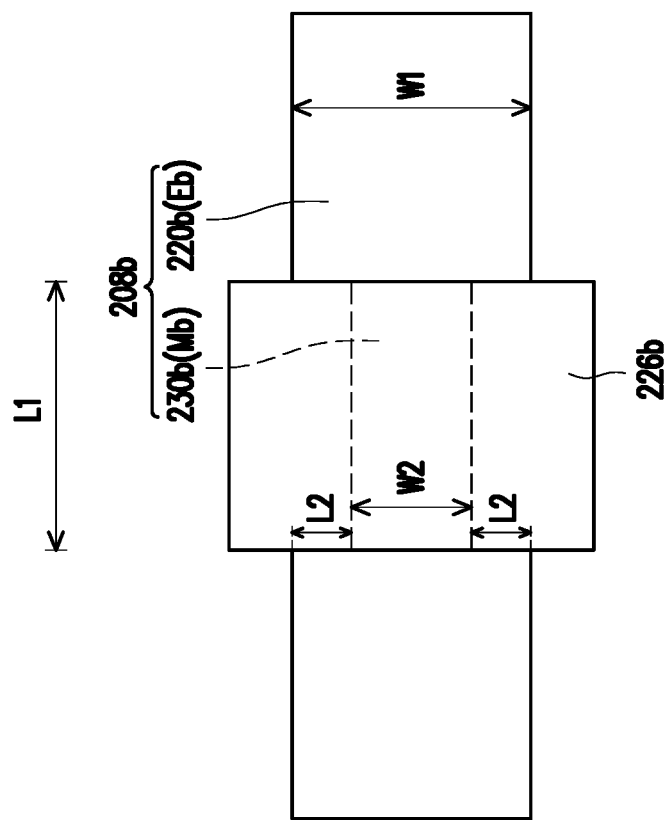
FIG. 4 is a top view of a semiconductor fin and a gate electrode in a FinFET located in a second region of a semiconductor device in accordance with some embodiments of the present disclosure.

FIG. 3 is a top view of the first semiconductor fin 208a and the first gate electrode 216b in the first FinFET 10a located in the first region R1 of the semiconductor device 10 in accordance with some embodiments of the present disclosure. FIG. 4 is a top view of the second semiconductor fin 208b and the second gate electrode 226b in the second FinFET 10b located in the second region R2 of a semiconductor device 10 in accordance with some embodiments of the present disclosure. In order to clearly illustrate the relationship between the first gate electrode 216b and the first semiconductor fin 208a, other components in the first FinFET 10a are omitted. Similarly, in order to clearly illustrate the relationship between the second gate electrode 226b and the second semiconductor fin 208b, other components in the second FinFET 10b are omitted.

Referring to FIG. 3, as mentioned above, since the middle portion Ma and end portions Ea of the first semiconductor fin 208a are protected by the first S/D 214a, the interlayer dielectric layer 300, the first spacers 212c, and the photoresist layer PR are not subjected to the etching process illustrated in FIG. 1L and FIG. 2L, the width w1 of the channel region 230a (the middle portion Ma) of the first semiconductor fin 208a is substantially equal to the widths w1 of the source/drain regions 220a (the end portions Ea) of the first semiconductor fin 208a. In other words, each first semiconductor fin 208a has a substantially uniform width w1 as illustrated in FIG. 3. Under this configuration, the effective gate length in the first FinFET 10a may substantially equal to a length L1 of the first gate electrode 216b.

Referring to FIG. 4, as mentioned above, since the middle portion Mb of the second semiconductor fin 208b exposed by the hollow portion H and the opening OP of the photoresist layer PR is subjected to the etching process illustrated in FIG. 1L and FIG. 2L, the width w2 of the channel region 230a (the middle portion Mb) of the second semiconductor fin 208b is smaller than the widths w1 of the source/drain regions 220b (the end portions Eb) of the second semiconductor fin 208b. In other words, each second semiconductor fin 208b takes the form of an I-shape as illustrated in FIG. 4.

Referring to FIG. 3 and FIG. 4 simultaneously, a contact area between the second gate stack 226 (the second gate electrode 226b is illustrated for representation) and the second semiconductor fins 208a is larger than a contact area between the first gate stack 116 (the first gate electrode 216b is illustrated for representation) and the first semiconductor fins 208b due to the indentation represented by L2. In other words, since each second semiconductor fin 208b exhibits an I-shape, the effective gate length in the second FinFET 10b may be denoted by L1+2L2. With the increased effective gate length, the off state current (Ioff) of the second FinFET 10b may be decreased, thereby achieving better gate control of the second FinFET 10b. As a result, ultra-low power application may be adequately realized by the second FinFET 10b in the second region R2.

In accordance with some embodiments of the disclosure, a semiconductor device includes a semiconductor substrate, a plurality of insulators, a plurality of gate stacks, a first S/D, and a second S/D. The semiconductor substrate has a first region and a second region. The first region includes at least one first semiconductor fin and the second region includes at least one second semiconductor fin. A width of a middle portion of the first semiconductor fin is equal to widths of end portions of the first semiconductor fin. A width of a middle portion of the second semiconductor fin is smaller than widths of end portions of the second semiconductor fin. The insulators are disposed on the semiconductor substrate. The first semiconductor fin and the second semiconductor fin are sandwiched by the insulators. The gate stacks are over a portion of the first semiconductor fin and the second semiconductor fin. The first S/D covers another portion of the first semiconductor fin. The second S/D covers another portion of the second semiconductor fin.

In accordance with some alternative embodiments of the disclosure, a semiconductor device includes a semiconductor substrate having a first region and a second region, a first fin field effect transistor (FinFET) in the first region, and a second FinFET in the second region. The first FinFET includes at least one first semiconductor fin, a plurality of first insulators, a first gate stack, and a first S/D. The first semiconductor fin is on the semiconductor substrate and includes source/drain regions and a channel region. A width of the channel region of the first semiconductor fin is equal to widths of the source/drain regions of the first semiconductor fin. The first insulators are disposed on the semiconductor substrate. The first semiconductor fin is sandwiched by the first insulators. The first gate stack is over a portion of the first semiconductor fin and over a portion of the first insulators. The first S/D covers another portion of the first semiconductor fin. The second FinFET includes at least one second semiconductor fin, a plurality of second insulators, a second gate stack, and a second S/D. The second semiconductor fin is on the semiconductor substrate and includes source/drain regions and a channel region. A width of the channel region of the second semiconductor fin is smaller than widths of the source/drain regions of the second semiconductor fin. The second insulators are disposed on the semiconductor substrate. The second semiconductor fin is sandwiched by the second insulators. The second gate stack is over a portion of the second semiconductor fin and over a portion of the second insulators. The second S/D covers another portion of the second semiconductor fin.

In accordance with some embodiments of the disclosure, a method of manufacturing a semiconductor device includes at least the following steps. A semiconductor substrate having a first region and a second region is provided. The semiconductor substrate is patterned to form a plurality of trenches in the semiconductor substrate, at least one first semiconductor fin between the trenches in the first region, and at least one second semiconductor fin between the trenches in the second region. A plurality of insulators are formed in the trenches. A plurality of dummy gate stacks are formed over a portion of the first semiconductor fin and a portion of the second semiconductor fin. A first S/D is formed over another portion of the first semiconductor fin and a second S/D is formed over another portion of the second semiconductor fin exposed by the dummy gate stacks. Portions of the dummy gate stacks are removed to expose a middle portion of the first semiconductor fin and a middle portion of the second semiconductor fin. A photoresist layer is formed to cover the middle portion of the first semiconductor fin and to expose the middle portion of the second semiconductor fin. Part of the middle portion of the second semiconductor fin is removed. The photoresist layer is removed. A gate dielectric material and a gate electrode material are formed over the exposed portion of the first semiconductor fin and the exposed portion of the second semiconductor fin to form a plurality of gate stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate having a first region and a second region, wherein the first region comprises at least one first semiconductor fin and the second region comprises at least one second semiconductor fin, a width of a middle portion of the at least one first semiconductor fin is equal to widths of end portions of the at least one first semiconductor fin, a width of a middle portion of the at least one second semiconductor fin is smaller than widths of end portions of the at least one second semiconductor fin, a dopant of the at least one first semiconductor fin and the at least one second semiconductor fin comprises boron, $BF_2$, phosphorus, arsenic, or a combination thereof, a dopant concentration within the at least one first semiconductor fin ranges from $2\times10^{11}$ atom/cm$^2$ to $1\times10^{12}$ atom/cm$^2$ and a dopant concentration within the at least one second semiconductor fin ranges from $2\times10^{12}$ atom/cm$^2$ to $5\times10^{14}$ atom/cm$^2$ while satisfying that the dopant concentration within the at least one second semiconductor fin is greater than the dopant concentration within the at least one first semiconductor fin;
   a plurality of insulators disposed on the semiconductor substrate, wherein the at least one first semiconductor fin and the at least one second semiconductor fin are sandwiched by the plurality of insulators;
   a plurality of gate stacks over a portion of the at least one first semiconductor fin and a portion of the at least one second semiconductor fin;
   a first S/D covering another portion of the at least one first semiconductor fin; and
   a second S/D covering another portion of the at least one second semiconductor fin.

2. The semiconductor device according to claim 1, wherein a contact area between the plurality of gate stacks and the at least one second semiconductor fin is larger than a contact area between the plurality of gate stacks and the at least one first semiconductor fin.

3. The semiconductor device according to claim 1, wherein each of the plurality of gate stack comprises:
   a gate dielectric layer over the at least one first semiconductor fin or the at east one second semiconductor fin;
   a gate electrode disposed over the gate dielectric layer; and
   a plurality of spacers disposed on sidewalls of the gate dielectric layer and the gate electrode.

4. The semiconductor device according to claim 3, wherein a thickness of the gate electrode over the at least one first semiconductor fin is different from a thickness of the gate electrode over the at least one second semiconductor fin.

5. The semiconductor device according to claim 3, wherein a material of the gate electrode comprises metal, metal alloy, or metal nitride.

6. The semiconductor device according to claim 1, further comprising an interlayer dielectric layer covering the first S/D and the second S/D, wherein a top surface of the interlayer dielectric layer is coplanar with top surfaces of the plurality of gate stacks.

7. A semiconductor device, comprising:
   a semiconductor substrate having a first region and a second region;

a first fin field effect transistor (FinFET) in the first region, comprising:
  at least one first semiconductor fin on the semiconductor substrate, wherein the at least one first semiconductor fin comprises source/drain regions and a channel region, a width of the channel region of the at least one first semiconductor fin is equal to widths of the source/drain regions of the at least one first semiconductor fin, a dopant of the at least one first semiconductor fin comprises boron, $BF_2$, phosphorus, arsenic, or a combination thereof, and a dopant concentration within the at least one first semiconductor fin ranges from $2\times10^{11}$ atom/cm$^2$ to $1\times10^{12}$ atom/cm$^2$;
  a plurality of first insulators disposed on the semiconductor substrate, wherein the at least one first semiconductor fin is sandwiched by the plurality of first insulators;
  a first gate stack over a portion of the at least one first semiconductor fin and over a portion of the plurality of first insulators; and
  a first S/D covering another portion of the at least one first semiconductor fin; and
a second FinFET in the second region, comprising:
  at least one second semiconductor fin on the semiconductor substrate, wherein the at least one second semiconductor fin comprises source/drain regions and a channel region, a width of the channel region of the at least one second semiconductor fin is smaller than widths of the source/drain regions of the at least one second semiconductor fin, a dopant of the at least one second semiconductor fin comprises boron, $BF_2$, phosphorus, arsenic, or a combination thereof, and a dopant concentration within the at least one second semiconductor fin ranges from $2\times10^{12}$ atom/cm$^2$ to $5\times10^{14}$ atom/cm$^2$ while satisfying that the dopant concentration within the at least one second semiconductor fin is greater than the dopant concentration within the at least one first semiconductor fin;
  a plurality of second insulators disposed on the semiconductor substrate, wherein the at least one second semiconductor fin is sandwiched by the plurality of second insulators;
  a second gate stack over a portion of the at least one second semiconductor fin and over a portion of the plurality of second insulators; and
  a second S/D covering another portion of the at least one second semiconductor fin.

8. The semiconductor device according to claim 7, wherein the at least one first semiconductor fin and the at least one second semiconductor fin respectively comprises a recessed portion, the first S/D fills into the recessed portion of the at least one first semiconductor fin to cover the source/drain regions of the at least one first semiconductor fin, and the second S/D fills into the recessed portion of the at least one second semiconductor fin to cover the source/drain regions of the at least one second semiconductor fin.

9. The semiconductor device according to claim 7, wherein a contact area between the second gate stack and the at least one second semiconductor fin is larger than a contact area between the first gate stack and the at least one first semiconductor fin.

10. The semiconductor device according to claim 7, wherein the first gate stack comprises:
  a first gate dielectric layer over the at least one first semiconductor fin;
  a first gate electrode disposed over the first gate dielectric layer; and
  a plurality of first spacers disposed on sidewalls of the first gate dielectric layer and the first gate electrode;
the second gate stack comprises:
  a second gate dielectric layer over the at least one second semiconductor fin;
  a second gate electrode disposed over the second gate dielectric layer, wherein the second gate electrode is in contact with side surfaces of the source/drain regions of the at least one second semiconductor fin; and
  a plurality of second spacers disposed on sidewalls of the second gate dielectric layer and the second gate electrode.

11. The semiconductor device according to claim 10, wherein a thickness of the first gate electrode is different from a thickness of the second gate electrode.

12. The semiconductor device according to claim 10, wherein a material of the first gate electrode and the second gate electrode comprises metal, metal alloy, or metal nitride.

13. The semiconductor device according to claim 10, wherein the first gate electrode is aligned with the channel region of the at least one first semiconductor fin, and the second gate electrode is aligned with the channel region of the at least one second semiconductor fin.

14. The semiconductor device according to claim 7, further comprising an interlayer dielectric layer covering the first S/D and the second S/D, wherein a top surface of the interlayer dielectric layer is coplanar with a top surface of the first gate stack and a top surface of the second gate stack.

15. A method of manufacturing a semiconductor device, comprising:
  providing a semiconductor substrate having a first region and a second region;
  patterning the semiconductor substrate to form a plurality of trenches in the semiconductor substrate, at least one first semiconductor fin between the trenches in the first region, and at least one second semiconductor fin between the trenches in the second region, wherein a dopant of the at least one first semiconductor fin and the at least one second semiconductor fin comprises boron, $BF_2$, phosphorus, arsenic, or a combination thereof, a dopant concentration within the at least one first semiconductor fin ranges from $2\times10^{11}$ atom/cm$^2$ to $1\times10^{12}$ atom/cm$^2$ and a dopant concentration within the at least one second semiconductor fin ranges from $2\times10^{12}$ atom/cm$^2$ to $5\times10^{14}$ atom/cm$^2$ while satisfying that the dopant concentration within the at least one second semiconductor fin is greater than the dopant concentration within the at least one first semiconductor fin;
  forming a plurality of insulators in the trenches;
  forming a plurality of dummy gate stacks over a portion of the at least one first semiconductor fin and a portion of the at least one second semiconductor fin;
  forming a first S/D over another portion of the at least one first semiconductor fin and forming a second S/D over another portion of the at least one second semiconductor fin exposed by the plurality of dummy gate stacks;
  removing portions of the plurality of dummy gate stacks to expose a middle portion of the at least one first semiconductor fin and a middle portion of the at least one second semiconductor fin;
  forming a photoresist layer to cover the middle portion of the at least one first semiconductor fin and to expose the middle portion of the at least one second semiconductor fin;

removing part of the middle portion of the at least one second semiconductor fin;

removing the photoresist layer; and forming a gate dielectric material and a gate electrode material over the exposed portion of the at least one first semiconductor fin and the exposed portion of the at least one second semiconductor fin to form a plurality of gate stacks.

16. The method according to claim 15, wherein each of the plurality of dummy gate stacks comprises a dummy gate, a dummy gate dielectric layer, and a plurality of spacers, and the step of removing portions of the plurality of dummy gate stacks comprises:

removing the dummy gate; and removing the dummy gate dielectric layer.

17. The method according to claim 15, wherein the step of removing part of the middle portion of the at least one second semiconductor fin comprises a dry etching process.

18. The method according to claim 15, further comprising:

removing a portion of the at least one first semiconductor fin and a portion of the at least one second semiconductor fin exposed by the plurality of dummy gate stacks to form a plurality of recessed portions, and the first S/D and the second S/D are filled into the plurality of recessed portions.

19. The method according to claim 15, wherein the gate electrode material over the at least one first semiconductor fin is formed to be have a different thickness from the gate electrode material over the at least one second semiconductor fin.

20. The method according to claim 15, further comprising:

forming an interlayer dielectric layer to cover the first S/D and the second S/D, wherein a top surface of the interlayer dielectric layer is coplanar with top surfaces of the plurality of gate stacks.

* * * * *